US011509317B2

(12) United States Patent
Jain et al.

(10) Patent No.: US 11,509,317 B2
(45) **Date of Patent: *Nov. 22, 2022**

(54) SYSTEMS AND METHODS FOR INTEGRATION OF INJECTION-LOCKED OSCILLATORS INTO TRANSCEIVER ARRAYS

(71) Applicant: Skyworks Solutions, Inc., Irvine, CA (US)

(72) Inventors: Sanjeev Jain, Kanata (CA); Foad Arfaei Malekzadeh, Irvine, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/243,355

(22) Filed: Apr. 28, 2021

(65) Prior Publication Data

US 2021/0359692 A1 Nov. 18, 2021

Related U.S. Application Data

(63) Continuation of application No. 16/598,925, filed on Oct. 10, 2019, now Pat. No. 11,025,258.

(Continued)

(51) Int. Cl.

*H03L 7/099* (2006.01)
*H03B 5/12* (2006.01)
*H04B 1/40* (2015.01)

(52) U.S. Cl.

CPC ......... *H03L 7/0992* (2013.01); *H03B 5/1237* (2013.01); *H04B 1/40* (2013.01); *H03B 2200/0074* (2013.01)

(58) Field of Classification Search

CPC .................................................... H03L 7/0992

See application file for complete search history.

(56) References Cited

U.S. PATENT DOCUMENTS 8,941,420 B2 * 1/2015 Zerbe ........................ H03L 7/06 327/119
9,020,011 B1 4/2015 Hiebert et al.

(Continued)

OTHER PUBLICATIONS

Bashir et al., "A Digitally Controlled Injection-Locked Oscillator With Fine Frequency Resolution," IEEE Journal of Solid-State Circuits, vol. 51, No. 6, pp. Jun. 2016Electronics letters, vol. 52, No. 2, pp. 1347-1360, Jun. 2016.

(Continued)

*Primary Examiner* — Joseph Chang

(74) *Attorney, Agent, or Firm* — Knobbe, Martens, Olson & Bear, LLP

(57) ABSTRACT

Systems and methods for integrating injection-locked oscillators into transceiver arrays are disclosed. In one aspect, there is provided an injection-locked oscillator (ILO) distribution system including a master clock generator configured to generate a master clock signal. The ILO distribution system also includes an ILO distribution circuit including an ILO and configured to receive the master clock signal. The ILO is configured to generate a reference clock signal based on the master clock signal. The ILO distribution circuit is further configured to generate an output signal indicative of an operating frequency of the ILO. The ILO distribution system further includes an injection-locked detector (ILD) configured to receive the master clock signal and the output signal. The ILD is further configured to determine whether the ILO is in a locked state or in an unlocked state based on the master clock signal and the output signal.

20 Claims, 21 Drawing Sheets

200
201B
201A
223
2
1
POLY-PHASE FILTER
225
ILO 211
TO MIXERS/ TRANSCEIVER 802
221
FREQ TRACKING LOOP (FTL)
FROM PULSE GENERATOR 207
231
809
817
fref
MASTER PLL 205
207
MULTI-PHASE CLOCK PULSE GENERATOR
INJECTION-LOCKED DETECTOR (ILD)
3
4
201C
201D

Related U.S. Application Data

(60) Provisional application No. 62/745,041, filed on Oct. 12, 2018, provisional application No. 62/745,036, filed on Oct. 12, 2018.

(56) References Cited

U.S. PATENT DOCUMENTS

| | | | |
|---|---|---|---|
| 11,025,258 | B2 | 6/2021 | Jain et al. |
| 11,025,259 | B2 | 6/2021 | Jain et al. |
| 2004/0198270 | A1 | 10/2004 | Rozenblit et al. |
| 2006/0267644 | A1 | 11/2006 | Youssoufian et al. |
| 2010/0158084 | A1 | 6/2010 | Voinigescu et al. |
| 2011/0003571 | A1 | 1/2011 | Park et al. |
| 2013/0033331 | A1 | 2/2013 | Raghunathan et al. |
| 2014/0016731 | A1 | 1/2014 | Okada et al. |
| 2014/0186045 | A1 | 7/2014 | Poddar et al. |
| 2014/0270003 | A1 | 9/2014 | Xu et al. |
| 2014/0347107 | A1 | 11/2014 | Kim |
| 2017/0324388 | A1 | 11/2017 | Soliman |
| 2018/0219516 | A1 | 8/2018 | Soliman |
| 2019/0097594 | A1 | 3/2019 | Soliman |
| 2019/0214354 | A1 | 7/2019 | Soliman et al. |
| 2020/0106403 | A1 | 4/2020 | Soliman |
| 2021/0320666 | A1 | 10/2021 | Jain et al. |

OTHER PUBLICATIONS

Buchanan et al., "Injection Locked Oscillator Lock Detector," Electronics letters, vol. 52, No. 2, pp. 141-143, Jan. 2016.

Hong et.al., "Noncontact proximity vital sign sensor based on PLL for sensitivity enhancement, IEEE Trans. Biomedical Circuits System", 2014, 8, (4), pp. 584-593.

Mangraviti et.al. "A mm-wave 40 nm CMOS subharmonically injection-locked QVCO with lock detection," Proc. IEEE Asia Solid-State Circuits Conf. (A-SSCC), Singapore, pp. 421-424, Nov. 2013.

Razavi, "A Study of Injection Locking and Pulling in Oscillators," IEEE J. Solid-State Circuits, vol. 39,No. 9, pp. 1415-1424, Sep. 2004.

Siriburanon et.al., "A Low-Power Low-Noise mm-Wave Subsampling PLL Using Dual-Step-Mixing ILFD and Tail-Coupling Quadrature Injection-Locked Oscillator for IEEE 802.11ad," IEEE J. Solid-State Circuits, vol. 51,No. 5, pp. 1246-1260, May 2016.

Stover, Theoretical explanation for the output spectra of unlocked driven oscillators, Proc IEEE. (Letters), 54, pp. 310-311, 1966.

* cited by examiner 200
201A
201B
201C
201D
1
2
3
4
ILO 211
FREQ TRACKING LOOP (FTL)
POLY-PHASE FILTER
÷CML
÷TSPC
221
223
225
227
229
TO MIXERS/ TRANSCEIVER 802
207
MULTI-PHASE CLOCK PULSE GENERATOR
MASTER PLL 205
fref
809
817
INJECTION-LOCKED DETECTOR (ILD)

200
201B
201A
201C
201D
2
1
3
4
POLY-PHASE FILTER
223
225
ILO 211
221
FREQ TRACKING LOOP (FTL)
231
TO MIXERS/ TRANSCEIVER 802
FROM PULSE GENERATOR 207
809
fref
MASTER PLL 205
207
MULTI-PHASE CLOCK PULSE GENERATOR
817
INJECTION-LOCKED DETECTOR (ILD)

200
201A
201B
201C
201D
1
2
3
4
QILO 211
221
225
231
FREQ TRACKING LOOP (FTL)
TO MIXERS/ TRANSCEIVER 102
TO MIXERS/ TRANSCEIVER 802
FROM PULSE GENERATOR 207
817
INJECTION-LOCKED DETECTOR (ILD)
207
MULTI-PHASE CLOCK PULSE GENERATOR
MASTER PLL 205
fref
809

SYSTEMS AND METHODS FOR INTEGRATION OF INJECTION-LOCKED OSCILLATORS INTO TRANSCEIVER ARRAYS

CROSS-REFERENCE TO RELATED APPLICATION(S)

This application is a continuation of U.S. application Ser. No. 16/598,925, filed Oct. 10, 2019, which claims the benefit of U.S. Provisional Application No. 62/745,036, filed Oct. 12, 2018, and the benefit of U.S. Provisional Application No. 62/745,041, filed Oct. 12, 2018, each of which is hereby incorporated by reference in its entirety.

BACKGROUND

Field

Embodiments of the described technology relate to electronic systems and methods, and in particular, to systems and methods for integrating injection-locked oscillators into transceiver arrays.

Description of the Related Technology

Certain communication standards may be implemented via a transceiver chip configured to transmit and receive radio frequency (RF) signals to/from one or more antennas. Revisions and improvements to communication standard (e.g., including the introduction of the 5G standard) may require the use of multiple antennas to fully implement communication in the required frequency bands (e.g., frequencies in the range of 6 GHz to 30 GHz). Thus, transceiver chips may be designed to properly interface with the multiple antennas at the required frequency bands.

SUMMARY

Aspects of this disclosure relate to techniques and electronic systems which can be used to integrate injection-locked oscillators into transceiver arrays and detect whether each of the injection-locked oscillators are is in a locked state or in an unlocked state. For example, in one aspect, there is provided an injection-locked oscillator distribution system, including a master clock generator configured to generate a master clock signal. The system also includes an injection-locked oscillator distribution circuit including an injection-locked oscillator and configured to receive the master clock signal, the injection-locked oscillator configured to generate a reference clock signal based on the master clock signal, the injection-locked oscillator distribution circuit further configured to generate an output signal indicative of an operating frequency of the injection-locked oscillator. The system further includes an injection-locked detector configured to receive the master clock signal and the output signal, the injection-locked detector further configured to determine whether the injection-locked oscillator is in a locked state or in an unlocked state based on the master clock signal and the output signal.

A method of detecting an injection-locked state is provided according to another aspect of the disclosure. The method includes generating, by a master clock generator, a master clock signal and receiving, at an injection-locked oscillator distribution circuit, the master clock signal, the injection-locked oscillator distribution circuit including an injection-locked oscillator. The method also includes generating, at the injection-locked oscillator, a reference clock signal based on the master clock signal and generating, at the injection-locked oscillator distribution circuit, an output signal indicative of an operating frequency of the injection-locked oscillator. The method further includes receiving, at an injection-locked detector, the master clock signal and the output signal and determining, by the injection-locked detector, whether the injection-locked oscillator is in a locked state or in an unlocked state based on the master clock signal and the output signal.

A mobile device is provided according to yet another aspect of the disclosure. The mobile device includes an antenna, a transceiver circuit operatively coupled to the antenna, the transceiver including a first mixer, and a master clock generator configured to generate a master clock signal. The mobile device also includes an injection-locked oscillator distribution circuit including an injection-locked oscillator and configured to receive the master clock signal, the injection-locked oscillator operatively coupled to the first mixer and configured to generate a reference clock signal based on the master clock signal and provide the reference clock signal to the first mixer, the injection-locked oscillator distribution circuit further configured to generate an output signal indicative of an operating frequency of the injection-locked oscillator. The mobile device further includes an injection-locked detector configured to receive the master clock signal and the output signal, the injection-locked detector further configured to determine whether the injection-locked oscillator is in a locked state or in an unlocked state based on the master clock signal and the output signal.

An injection-locked oscillator distribution system is provided according to still yet another aspect of the disclosure. The system includes a master clock generator configured to generate a master clock signal and a transceiver circuit including a plurality of mixers. The system further includes an injection-locked oscillator distribution circuit including a plurality of injection-locked oscillators, each of the injection-locked oscillators configured to receive the master clock signal, each of the injection-locked oscillators configured to generate a reference clock signal based on the master clock signal, each of the injection-locked oscillators configured to provide the reference clock signal to one of the mixers.

A method of distributing a reference clock signal is provided according to yet another aspect of the disclosure. The method includes generating, by a master clock generator, a master clock signal and receiving, at an injection-locked oscillator distribution circuit, the master clock signal, the injection-locked oscillator distribution circuit including a plurality of injection-locked oscillators. The method further includes generating, at each of the injection-locked oscillators, a reference clock signal based on the master clock signal and providing the reference clock signal from each of the injection-locked oscillators to the mixers.

A mobile device is provided according to yet another aspect of the disclosure. The mobile device includes an antenna, and a transceiver circuit operatively coupled to the antenna, the transceiver including a first mixer. The mobile device also includes a master clock generator configured to generate a master clock signal and a transceiver circuit including a plurality of mixers. The mobile device further includes an injection-locked oscillator distribution circuit including a plurality of injection-locked oscillators, each of the injection-locked oscillators configured to receive the master clock signal, each of the injection-locked oscillators configured to generate a reference clock signal based on the master clock signal, each of the injection-locked oscillators configured to provide the reference clock signal to one of the mixers.

DETAILED DESCRIPTION

Figure 1A:
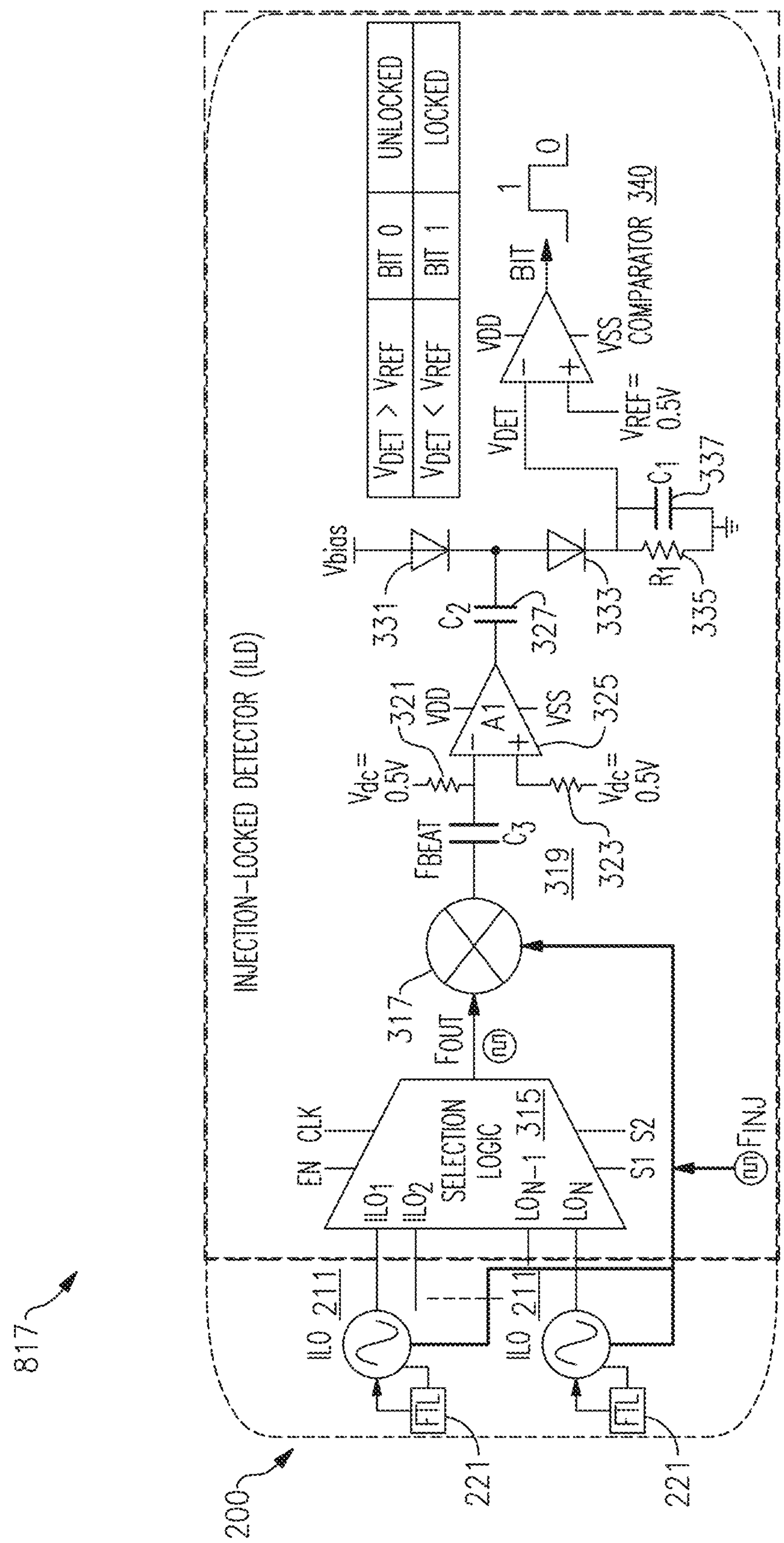
FIG. 1A is a schematic diagram of an example injection locked detector (ILD) according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Overview of Examples of Wireless Communication Systems

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet-of-Things (NB-IOT), Vehicle-to-Everything (V2X), and High Power User Equipment (HPUE).

3GPP introduced Phase 1 of fifth generation (5G) technology in Release 15 and plans to introduce Phase 2 of 5G technology in Release 16 (targeted for 2019). Release 15 at least partially addressed 5G communications at less than 6 GHz, while Release 16 is anticipated to address communications at 6 GHz and higher. Subsequent 3GPP releases will further evolve and expand 5G technology. 5G technology is also referred to herein as 5G New Radio (NR).

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1A is a schematic diagram of an example injection locked detector (ILD) according to one embodiment. In particular, FIG. 1A is an example of an ILD 117 configured to receive the output reference clock signals from each of a plurality of ILOs of an ILO distribution network and detect whether the injection-locked oscillator is in a locked state or in an unlocked state. Further detail regarding embodiments of the ILD 117 are provided below in connection with the description of FIG. 10 and the other figures.

Figure 1B:
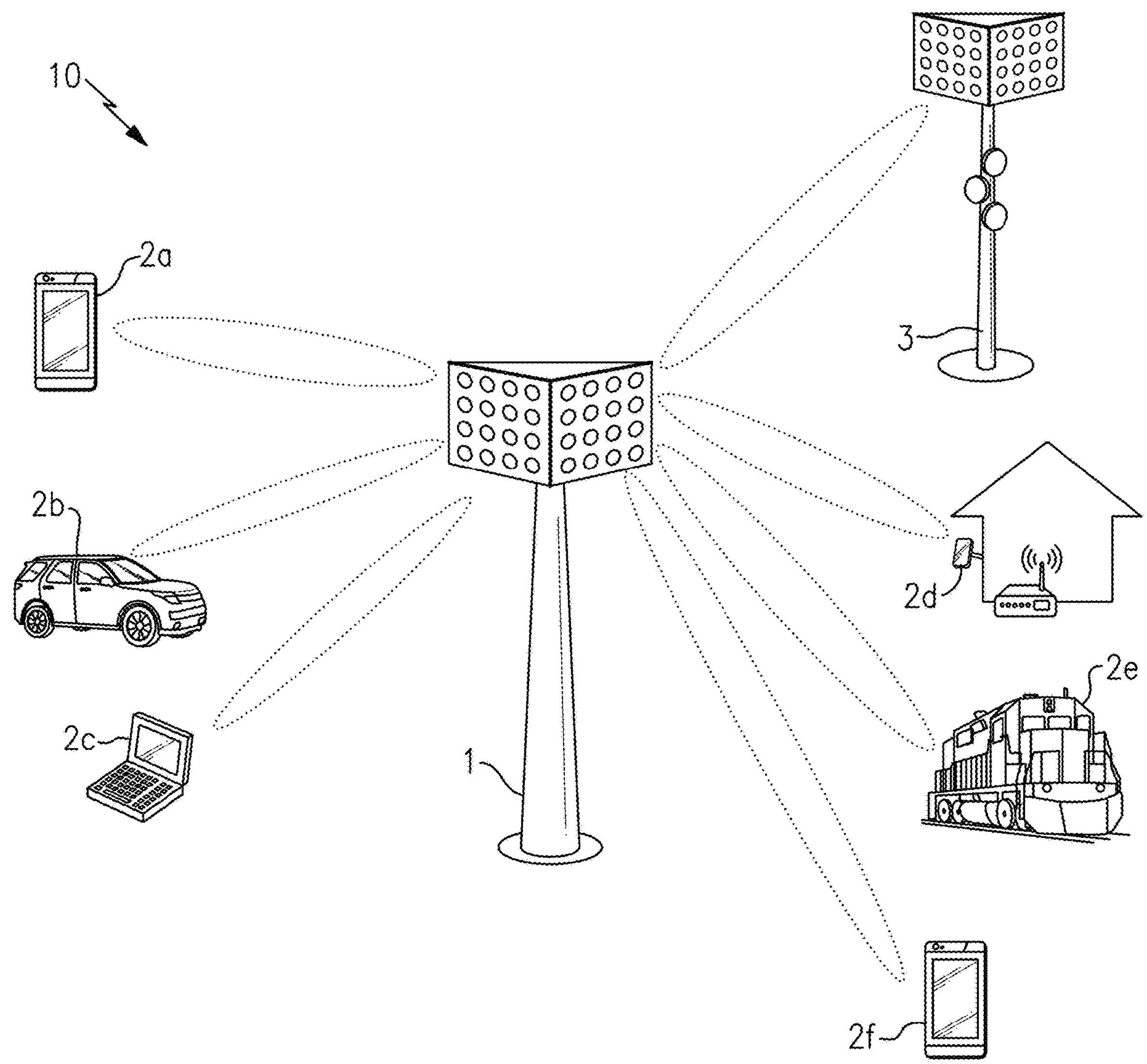
FIG. 1B is a schematic diagram of one example of a communication network.

FIG. 1B is a schematic diagram of one example of a communication network 10. The communication network 10 includes a macro cell base station 1, a small cell base station 3, and various examples of user equipment (UE), including a first mobile device 2*a*, a wireless-connected car 2*b*, a laptop 2*c*, a stationary wireless device 2*d*, a wireless-connected train 2*e*, and a second mobile device 2*f*.

Although specific examples of base stations and user equipment are illustrated in FIG. 1B, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1B supports communications using a variety of technologies, including, for example, 4G LTE, 5G NR, and wireless local area network (WLAN), such as Wi-Fi. Although various examples of communication technologies have been provided, the communication network 10 can be adapted to support a wide variety of communication technologies.

Various communication links of the communication network 10 have been depicted in FIG. 1B. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

Figure 2A:
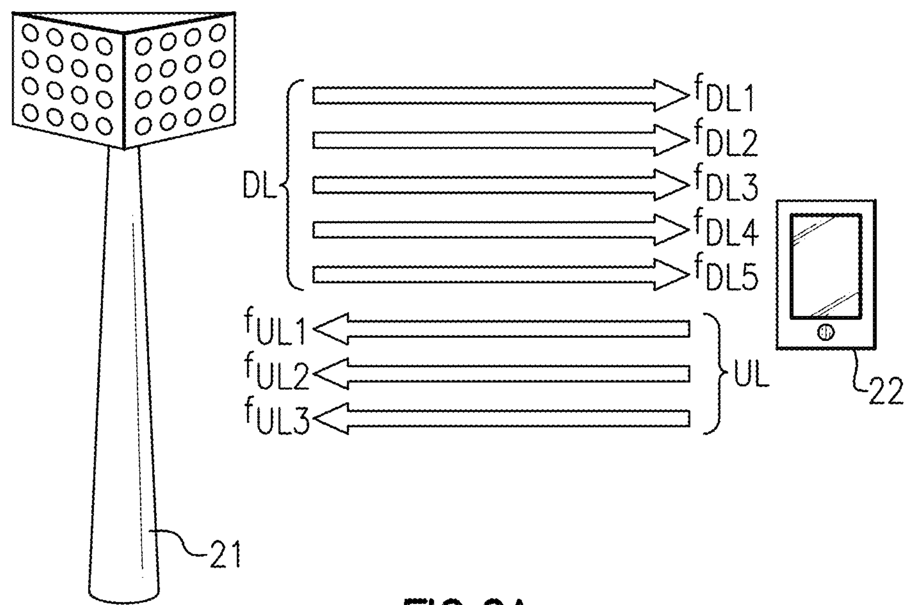
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
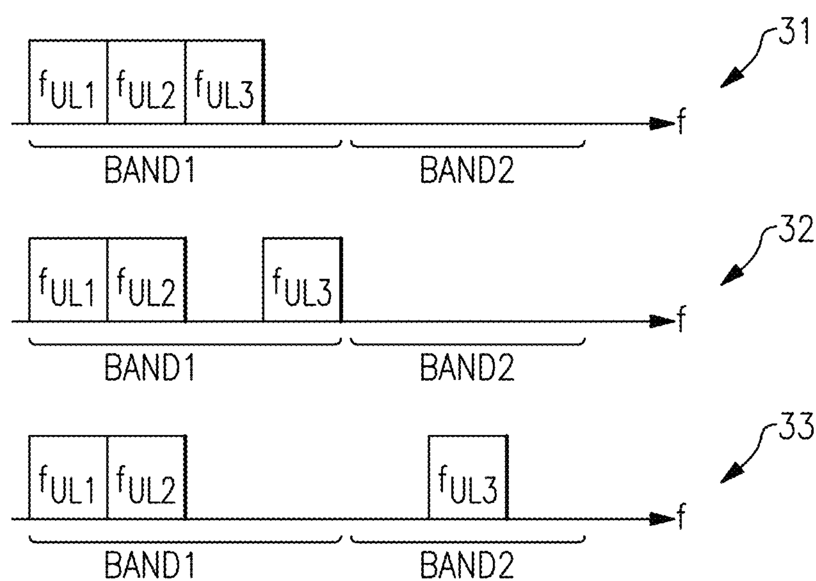
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
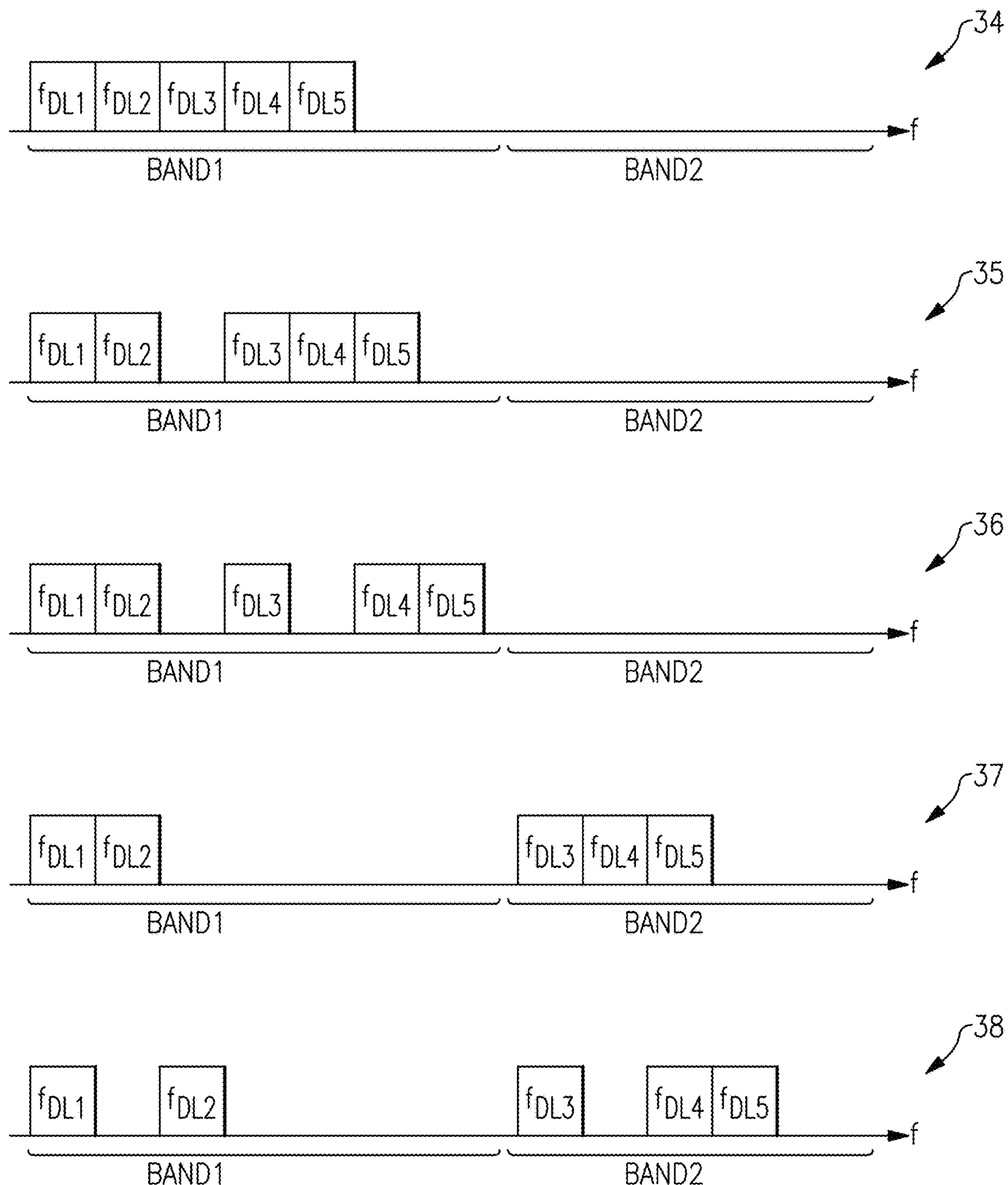
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
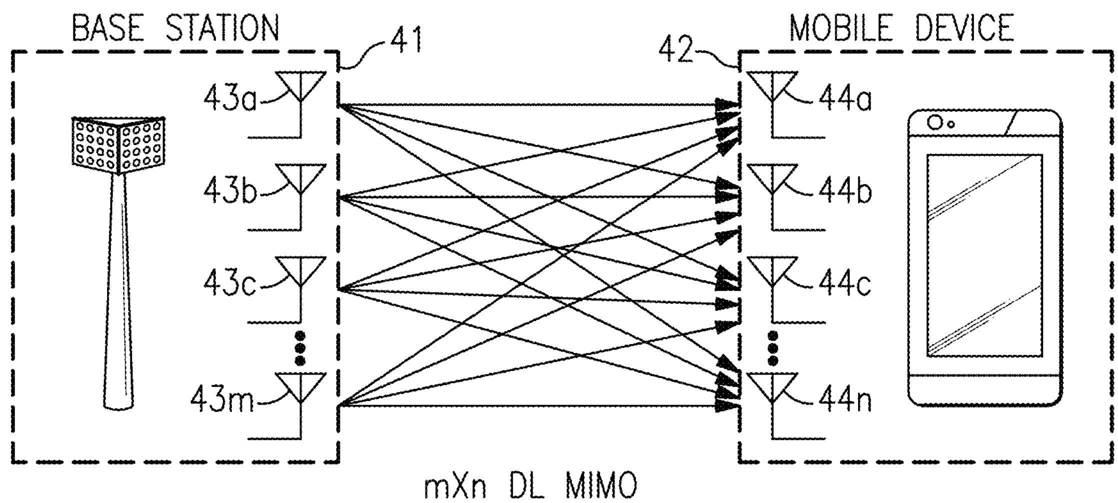
FIG. 3A is a schematic diagram of one example of a downlink channel using multi-input and multi-output (MIMO) communications.
Figure 3B:
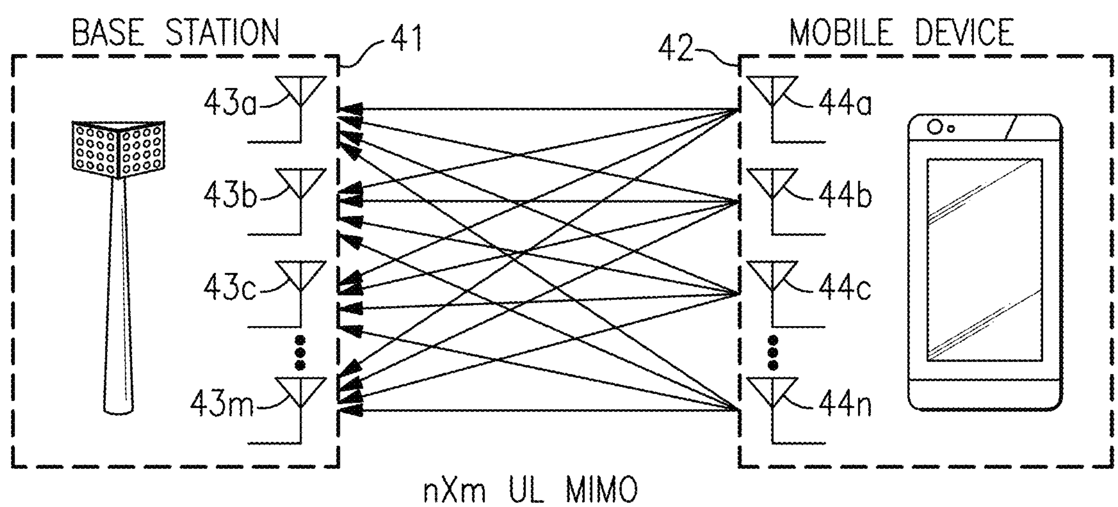
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43*a*, 43*b*, 43*c*, . . . 43*m* of the base station 41 and receiving using N antennas 44*a*, 44*b*, 44*c*, . . . 44*n* of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44*a*, 44*b*, 44*c*, . . . 44*n* of the mobile device 42 and receiving using M antennas 43*a*, 43*b*, 43*c*, . . . 43*m* of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
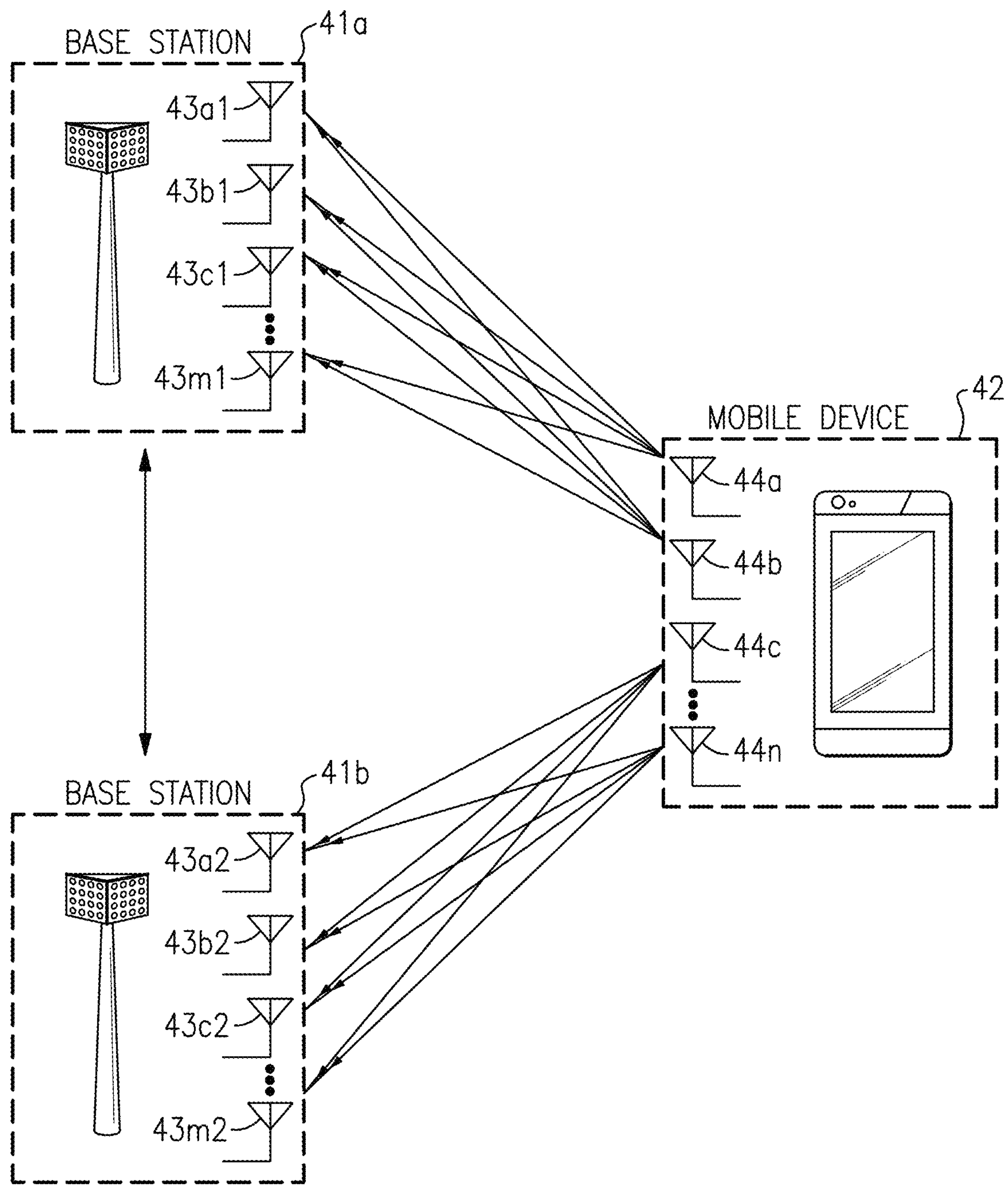
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44*a*, 44*b*, 44*c*, . . . 44*n* of the mobile device 42. Additional a first portion of the uplink transmissions are received using M antennas 43*a*1, 43*b*1, 43*c*1, 43*m*1 of a first base station 41*a*, while a second portion of the uplink transmissions are received using M antennas 43*a*2, 43*b*2, 43*c*2, 43*m*2 of a second base station 41*b*. Additionally, the first base station 41*a* and the second base station 41*b* communication with one another over wired, optical, and/or wireless links.

The MIMO scenario of FIG. 3C illustrates an example in which multiple base stations cooperate to facilitate MIMO communications.

Figure 5A:
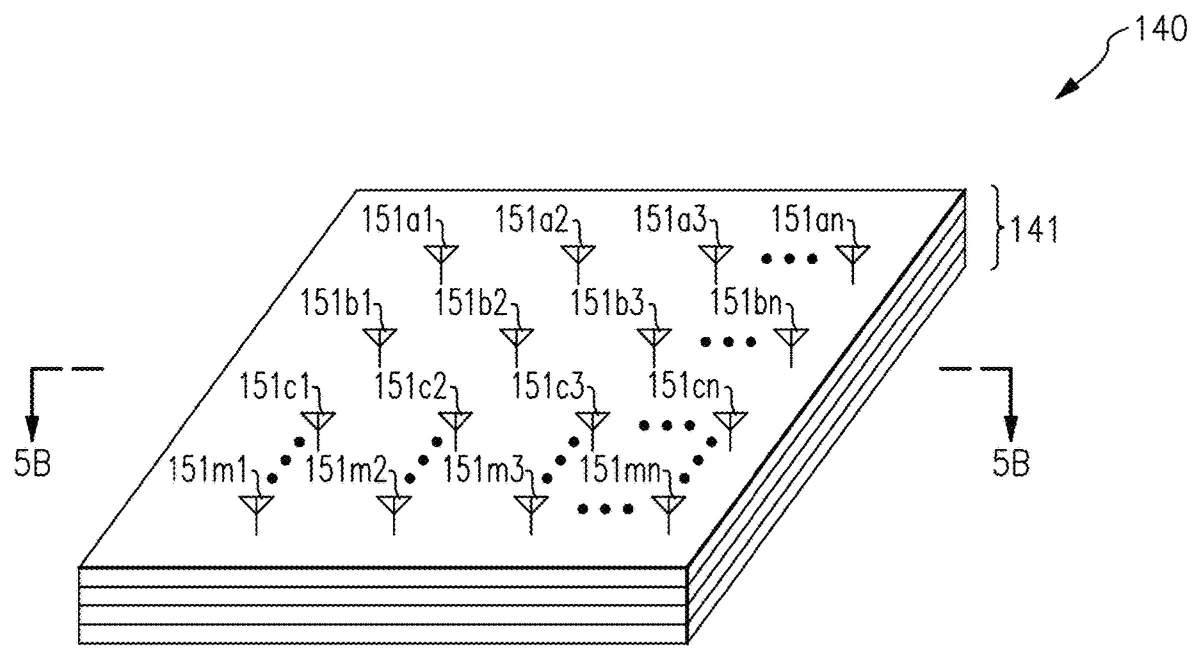
FIG. 5A is a perspective view of one embodiment of a module that operates with beamforming.

FIG. 5A is a schematic diagram of one example of a communication system 110 that operates with beamforming. The communication system 110 includes a transceiver 105, signal conditioning circuits 104*a*1, 104*a*2, . . . 104*an*, 104*b*1, 104*b*2 . . . 104*b*n, 104*m*1, 104*m*2 . . . 104*mn*, and an antenna array 102 that includes antenna elements 103*a*1, 103*a*2 . . . 103*a*n, 103*b*1, 103*b*2 . . . 103*b*n, 103*m*1, 103*m*2 . . . 103*mn*.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

Figure 4A:
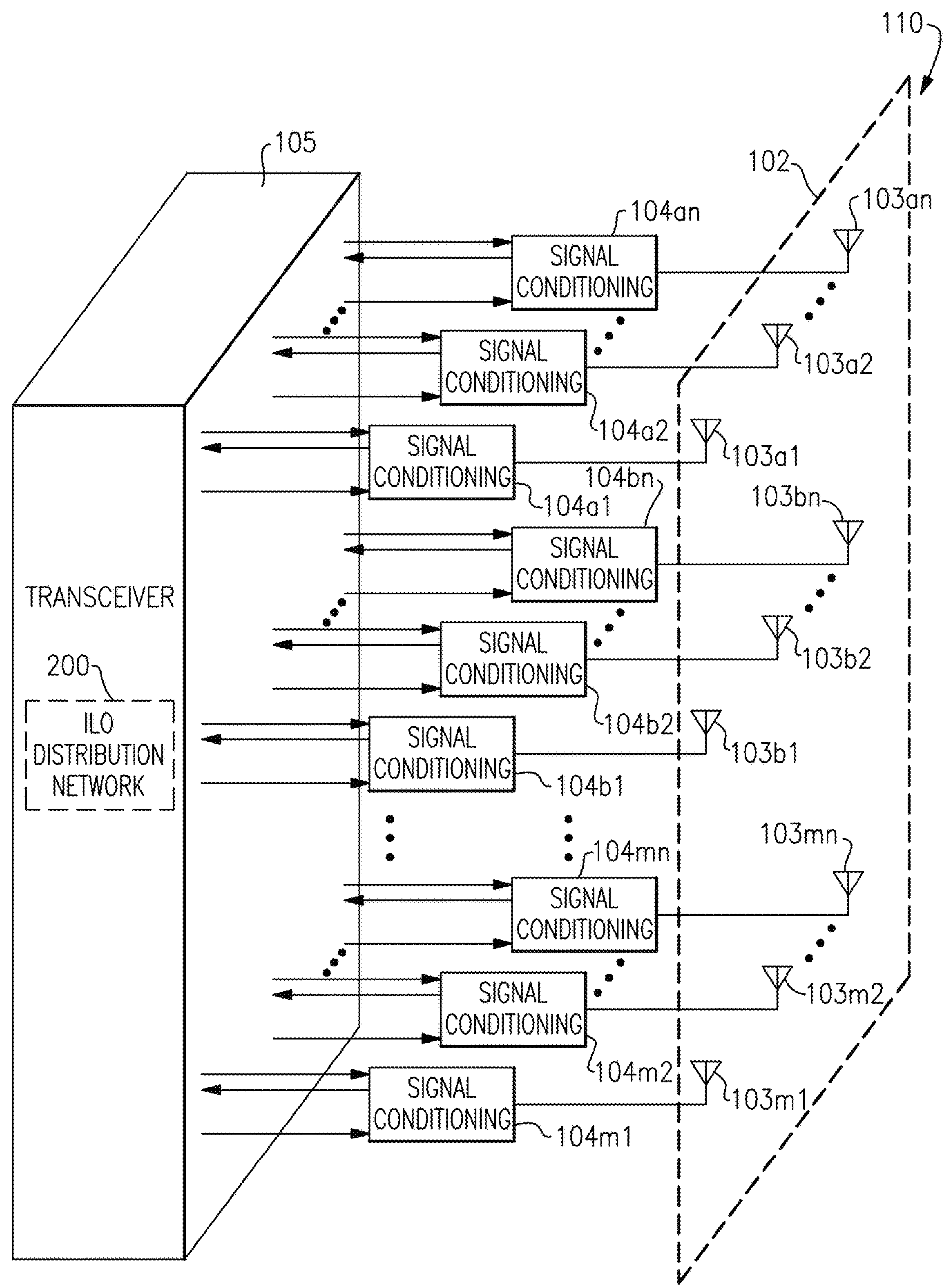
FIG. 4A is a schematic diagram of one example of a communication system that operates with beamforming.

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

Figure 4B:
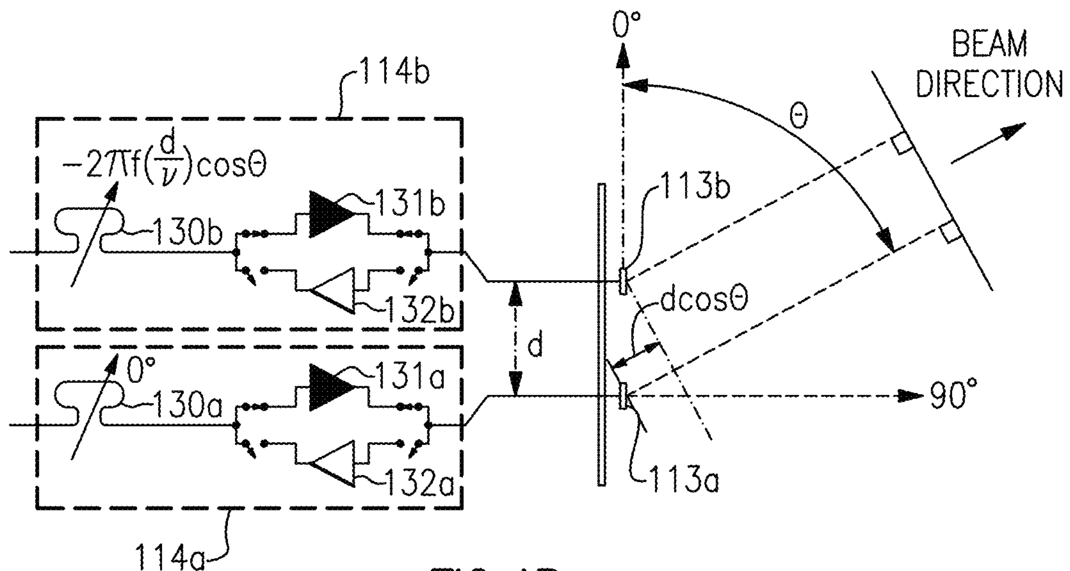
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit 114*a*, a second signal conditioning circuit 114*b*, a first antenna element 113*a*, and a second antenna element 113*b*.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114*a* includes a first phase shifter 130*a*, a first power amplifier 131*a*, a first low noise amplifier (LNA) 132*a*, and switches for controlling selection of the power amplifier 131*a* or LNA 132*a*. Additionally, the second signal conditioning circuit 114*b* includes a second phase shifter 130*b*, a second power amplifier 131*b* a second LNA 132*b*, and switches for controlling selection of the power amplifier 131*b* or LNA 132*b*.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113*a* and the second antenna element 113*b* are separated by a distance d. Additionally, FIG. 4B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113*a*, 113*b*, a desired transmit beam angle θ can be achieved. For example, when the first phase shifter 130*a* has a reference value of 0°, the second phase shifter 130*b* can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130*b* can be controlled to provide a phase shift of about $-\pi\cos\theta$ radians to achieve a transmit beam angle θ.

Accordingly, the relative phase of the phase shifters 130*a*, 130*b* can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

Figure 4C:
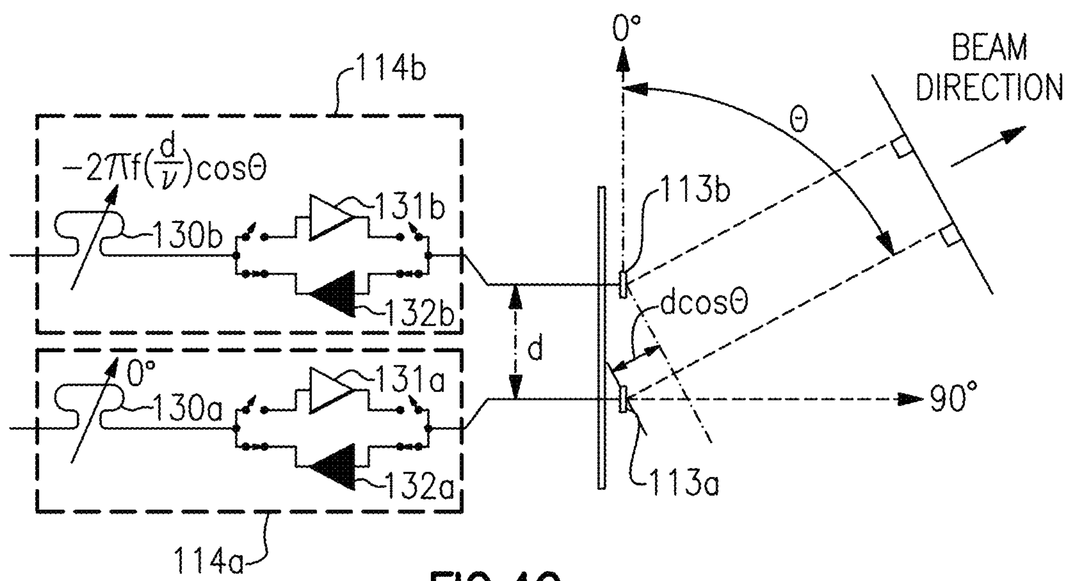
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130*a* and the second phase shifter 130*b* can be selected to about equal to $-2\pi f(d/v)\cos\theta$ radians to achieve a desired receive beam angle θ. In implementations in which the distance d corresponds to about ½λ, the phase difference can be selected to about equal to $-\pi\cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Figure 5B:
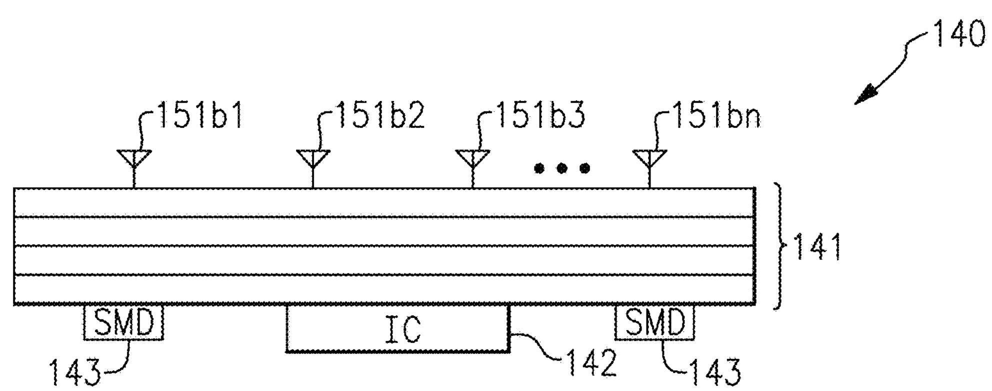
FIG. 5B is a cross-section of the module of FIG. 6A taken along the lines 6B-6B.

FIG. 5A is a perspective view of one embodiment of a module 140 that operates with beamforming. FIG. 5B is a cross-section of the module 140 of FIG. 5A taken along the lines 6B-6B.

The module 140 includes a laminated substrate or laminate 141, a semiconductor die or IC 142 (not visible in FIG. 5A), surface mount devices (SMDs) 143 (not visible in FIG. 5A), and an antenna array including antenna elements 151*a*1, 151*a*2, 151*a*3, 151*an*, 151*b*1, 151*b*2, 151*b*3 . . . 151*bn*, 151*c*1, 151*c*2, 151*c*3 151*cn*, 151*m*1, 151*m*2, 151*m*3 151*mn*.

Although one embodiment of a module is shown in FIGS. 5A and 5B, the teachings herein are applicable to modules implemented in a wide variety of ways. For example, a module can include a different arrangement of and/or number of antenna elements, dies, and/or surface mount devices. Additionally, the module 140 can include additional structures and components including, but not limited to, encapsulation structures, shielding structures, and/or wirebonds.

The antenna elements antenna elements 151*a*1, 151*a*2, 151*a*3 . . . 151*an*, 151*b*1, 151*b*2, 151*b*3 . . . 151*bn*, 151*c*1, 151*c*2, 151*c*3 151*cn*, 151*m*1, 151*m*2, 151*m*3 . . . 151*mn* are formed on a first surface of the laminate 141, and can be used to receive and/or transmit signals, based on implementation. Although a 4×4 array of antenna elements is shown, more or fewer antenna elements are possible as indicated by ellipses. Moreover, antenna elements can be arrayed in other patterns or configurations, including, for instance, arrays using non-uniform arrangements of antenna elements. Furthermore, in another embodiment, multiple antenna arrays are provided, such as separate antenna arrays for transmit and receive and/or for different communication bands.

In the illustrated embodiment, the IC 142 is on a second surface of the laminate 141 opposite the first surface. However, other implementations are possible. In one example, the IC 142 is integrated internally to the laminate 141.

In certain implementations, the IC 142 includes signal conditioning circuits associated with the antenna elements 151*a*1, 151*a*2, 151*a*3 151*an*, 151*b*1, 151*b*2, 151*b*3 . . . 151*bn*, 151*c*1, 151*c*2, 151*c*3 . . . 151*cn*, 151*m*1, 151*m*2, 151*m*3 . . . 151*mn*. In one embodiment, the IC 142 includes a serial interface, such as a mobile industry processor interface radio frequency front-end (MIPI RFFE) bus and/or inter-integrated circuit (I2C) bus that receives data for controlling the signal conditioning circuits, such as the amount of phase shifting provided by phase shifters. In another embodiment, the IC 142 includes signal conditioning circuits associated with the antenna elements 151*a*1, 151*a*2, 151*a*3 . . . 151*an*, 151*b*1, 151*b*2, 151*b*3 . . . 151*bn*, 151*c*1, 151*c*2, 151*c*3 . . . 151*cn*, 151*m*1, 151*m*2, 151*m*3 . . . 151*mn* and an integrated transceiver.

The laminate 141 can include various structures including, for example, conductive layers, dielectric layers, and/or solder masks. The number of layers, layer thicknesses, and materials used to form the layers can be selected based on a wide variety of factors, and can vary with application and/or implementation. The laminate 141 can include vias for providing electrical connections to signal feeds and/or ground feeds of the antenna elements. For example, in certain implementations, vias can aid in providing electrical connections between signal conditioning circuits of the IC 142 and corresponding antenna elements.

The antenna elements 151*a*1, 151*a*2, 151*a*3 151*an*, 151*b*1, 151*b*2, 151*b*3 . . . 151*bn*, 151*c*1, 151*c*2, 151*c*3 151*cn*, 151*m*1, 151*m*2, 151*m*3 151*mn* can correspond to antenna elements implemented in a wide variety of ways. In one example, the array of antenna elements includes patch antenna element formed from a patterned conductive layer on the first side of the laminate 141, with a ground plane formed using a conductive layer on opposing side of the laminate 141 or internal to the laminate 141. Other examples of antenna elements include, but are not limited to, dipole antenna elements, ceramic resonators, stamped metal antennas, and/or laser direct structuring antennas.

The module 140 can be included a communication system, such as a mobile phone or base station. In one example, the module 140 is attached to a phone board of a mobile phone.

Figure 6:
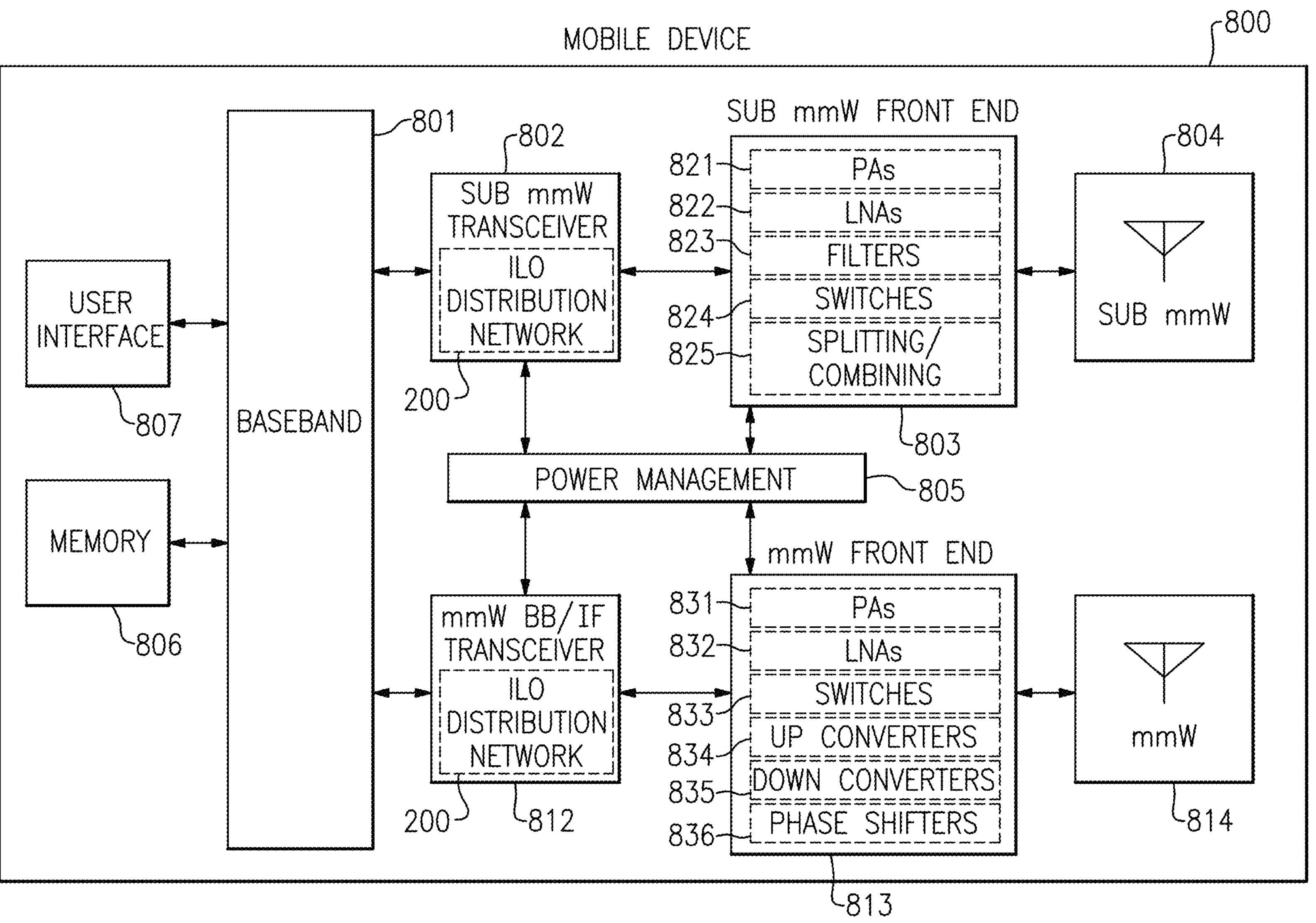
FIG. 6 is a schematic diagram of one embodiment of a mobile device.

FIG. 6 is a schematic diagram of one embodiment of a mobile device 800. The mobile device 800 includes a baseband system 801, a sub millimeter wave (mmW) transceiver 802, a sub mmW front end system 803, sub mmW antennas 804, a power management system 805, a memory 806, a user interface 807, a mmW baseband (BB)/intermediate frequency (IF) transceiver 812, a mmW front end system 813, and mmW antennas 814.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

In the illustrated embodiment, the sub mmW transceiver 802, sub mmW front end system 803, and sub mmW antennas 804 serve to transmit and receive centimeter waves and other radio frequency signals below millimeter wave frequencies. Additionally, the mmW BB/IF transceiver 812, mmW front end system 813, and mmW antennas 814 serve to transmit and receive millimeter waves. Although one specific example is shown, other implementations are possible, including, but not limited to, mobile devices operating using circuitry operating over different frequency ranges and wavelengths.

The sub mmW transceiver 802 generates RF signals for transmission and processes incoming RF signals received from the sub mmW antennas 804. It will be understood that various functionalities associated with the transmission and receiving of RF signals can be achieved by one or more components that are collectively represented in FIG. 6 as the sub mmW transceiver 802. In one example, separate components (for instance, separate circuits or dies) can be provided for handling certain types of RF signals.

The sub mmW front end system 803 aids is conditioning signals transmitted to and/or received from the antennas 804. In the illustrated embodiment, the front end system 803 includes power amplifiers (PAs) 821, low noise amplifiers (LNAs) 822, filters 823, switches 824, and signal splitting/combining circuitry 825. However, other implementations are possible.

For example, the sub mmW front end system 803 can provide a number of functionalizes, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The sub mmW antennas 804 can include antennas used for a wide variety of types of communications. For example, the sub mmW antennas 804 can include antennas for transmitting and/or receiving signals associated with a wide variety of frequencies and communications standards.

The mmW BB/IF transceiver 812 generates millimeter wave signals for transmission and processes incoming millimeter wave signals received from the mmW antennas 814. It will be understood that various functionalities associated with the transmission and receiving of RF signals can be achieved by one or more components that are collectively represented in FIG. 6 as the mmW transceiver 812. The mmW BB/IF transceiver 812 can operate at baseband or intermediate frequency, based on implementation.

The mmW front end system 813 aids is conditioning signals transmitted to and/or received from the mmW antennas 814. In the illustrated embodiment, the front end system 803 includes power amplifiers 831, low noise amplifiers 832, switches 833, up converters 834, down converters 835, and phase shifters 836. However, other implementations are possible. In one example, the mobile device 800 operates with a BB mmW transceiver, and up converters and downconverters are omitted from the mmW front end system. In another example, the mmW front end system further includes filters for filtering millimeter wave signals.

The mmW antennas 814 can include antennas used for a wide variety of types of communications. The mmW antennas 814 can include antenna elements implemented in a wide variety of ways, and in certain configurations the antenna elements are arranged to form one or more antenna arrays. Examples of antenna elements for millimeter wave antenna arrays include, but are not limited to, patch antennas, dipole antenna elements, ceramic resonators, stamped metal antennas, and/or laser direct structuring antennas.

In certain implementations, the mobile device 800 supports MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

In certain implementations, the mobile device 800 operates with beamforming. For example, the mmW front end system 803 includes amplifiers having controllable gain and phase shifters having controllable phase to provide beam formation and directivity for transmission and/or reception of signals using the mmW antennas 814. For example, in the context of signal transmission, the amplitude and phases of the transmit signals provided to an antenna array used for transmission are controlled such that radiated signals combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antenna array from a particular direction.

The baseband system 801 is coupled to the user interface 807 to facilitate processing of various user input and output (I/O), such as voice and data. The baseband system 801 provides the sub mmW and mmW transceivers with digital representations of transmit signals, which are processed by the transceivers to generate RF signals for transmission. The baseband system 801 also processes digital representations of received signals provided by the transceivers. As shown in FIG. 6, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers of the front end systems. For example, the power management system 805 can be configured to change the supply voltage(s) provided to one or more of the power amplifiers to improve efficiency, such as power added efficiency (PAE).

In certain implementations, the power management system 805 receives a battery voltage from a battery. The battery can be any suitable battery for use in the mobile device 800, including, for example, a lithium-ion battery.

Figure 7:
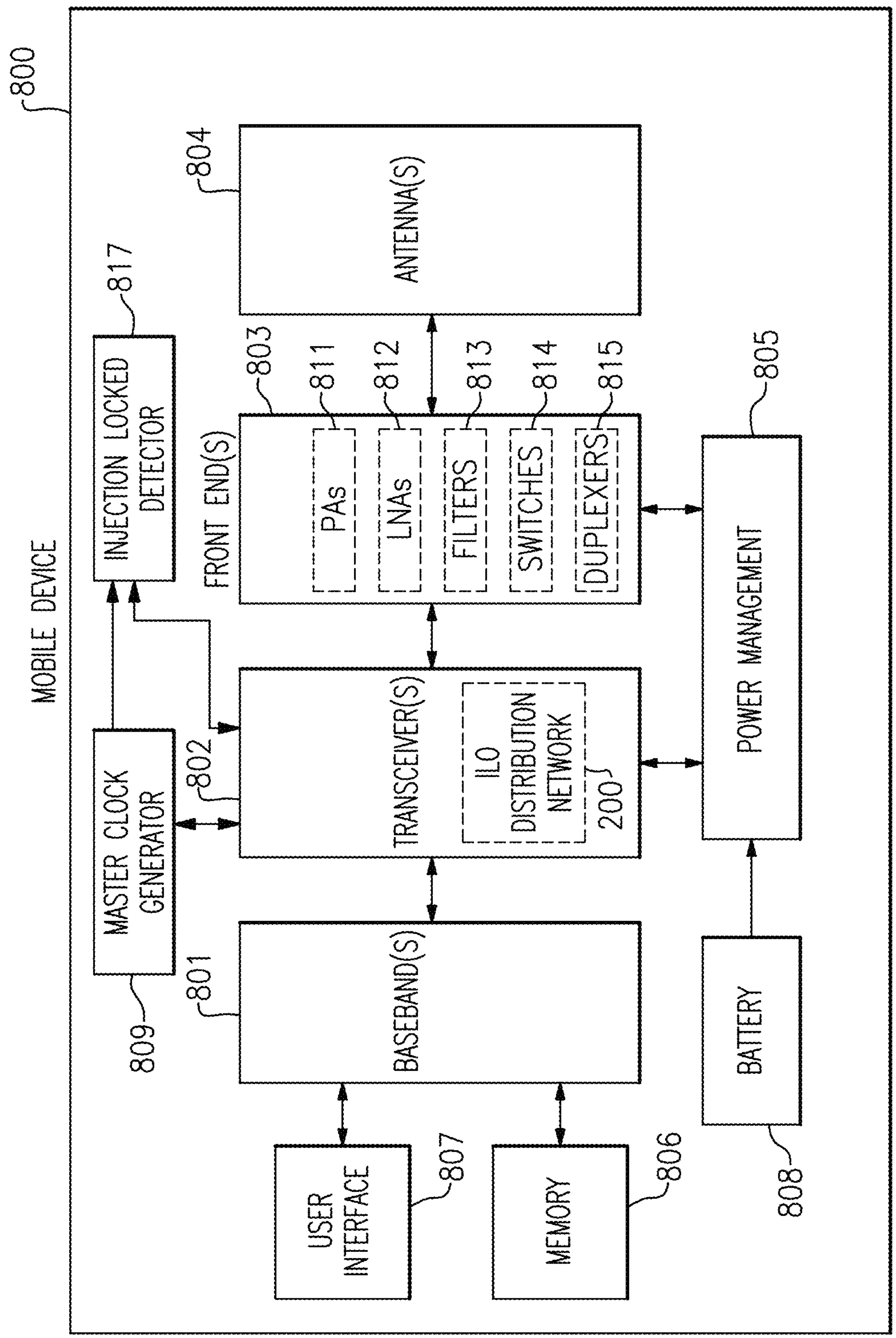
FIG. 7 is a schematic diagram of another embodiment of a mobile device.

FIG. 7 is a schematic diagram of another embodiment of a mobile device 800. The mobile device 800 includes one or more baseband systems 801, one or more transceivers 802, one or more front end systems 803, one or more antenna(s) 804, a power management system 805, a memory 806, a user interface 807, and a battery 808. The mobile device 800 further includes a master clock generator 809 and an injection locked detector (ILD) 817.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver(s) 802 generate RF signals for transmission and process incoming RF signals received from the antenna(s) 804. It will be understood that various functionalities associated with the transmission and receiving of RF signals can be achieved by one or more components that are collectively represented in FIG. 7 as the transceiver(s) 802. In one example, separate components (for instance, separate circuits or dies) can be provided for handling certain types of RF signals.

The front end system(s) 803 aid in conditioning signals transmitted to and/or received from the antenna(s) 804. In the illustrated embodiment, the front end system(s) 803 include power amplifiers (PAs) 811, low noise amplifier(s) (LNAs) 812, filters 813, switches 814, and duplexers 815. However, other implementations are possible.

For example, the front end system(s) 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antenna(s) 804 can include antennas used for a wide variety of types of communications. For example, the antenna(s) 804 can include antennas for transmitting and/or receiving signals associated with a wide variety of frequencies and communications standards.

In certain implementations, the antenna(s) 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system(s) 803 can include phase shifters having variable phase controlled by the transceiver(s) 802. Additionally, the phase shifters are controlled to provide beam formation and directivity for transmission and/or reception of signals using the antenna(s) 804. For example, in the context of signal transmission, the phases of the transmit signals provided to the antenna(s) 804 are controlled such that radiated signals from the antenna(s) 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antenna(s) 804 from a particular direction. In certain implementations, the antenna(s) 804 include one or more arrays of antenna elements to enhance beamforming.

The baseband system(s) (also simply referred to as baseband(s)) 801 are coupled to the user interface 807 to facilitate processing of various user input and output (I/O), such as voice and data. The baseband system(s) 801 provide the transceiver(s) 802 with digital representations of transmit signals, which the transceiver(s) 802 process to generate RF signals for transmission. The baseband system(s) 801 also process digital representations of received signals provided by the transceiver(s) 802. As shown in FIG. 7, the baseband system(s) 801 are coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 7, the power management system 805 receives a battery voltage from the battery 808. The battery 808 can be any suitable battery for use in the mobile device 800, including, for example, a lithium-ion battery.

Figure 10:
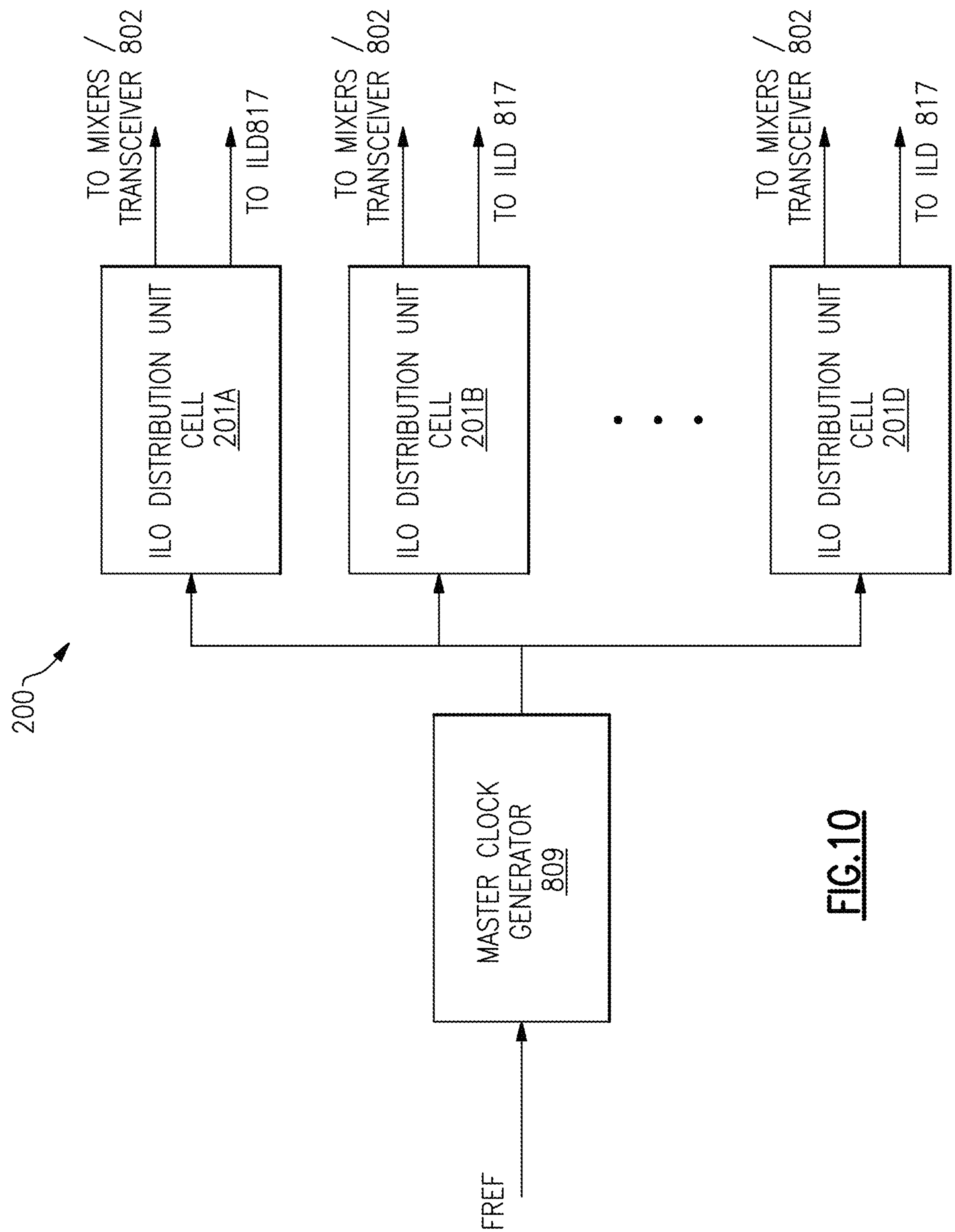
FIG. 10 is a block diagram of an example injection-locked oscillator (ILO) distribution network according to one embodiment.

The master clock generator 809 generates a master clock signal which is provided to the transceiver(s) 802. As described in more detail below, the master clock signal may be used by component(s) of the transceiver(s) 802 to generate clock signal(s) which may be used as a clock input to mixer(s) of, for example, modulator(s) and/or demodulator(s) of the transceiver(s) 802. In some implementations, the transceiver(s) 802 may include one or more injection-locked oscillator(s) (ILOs) (e.g., as illustrated in FIG. 10) which generate clock signals based on the master clock signal.

The injection locked detector 817 receives the clock signal(s), generated based on the master clock signal, from the transceiver(s) 802. The injection locked detector 817 may also be configured to determine whether the ILOs are operating in an injection-locked region. Additional details regarding the functionality of the injection locked detector 817 are provided below.

Figure 8:
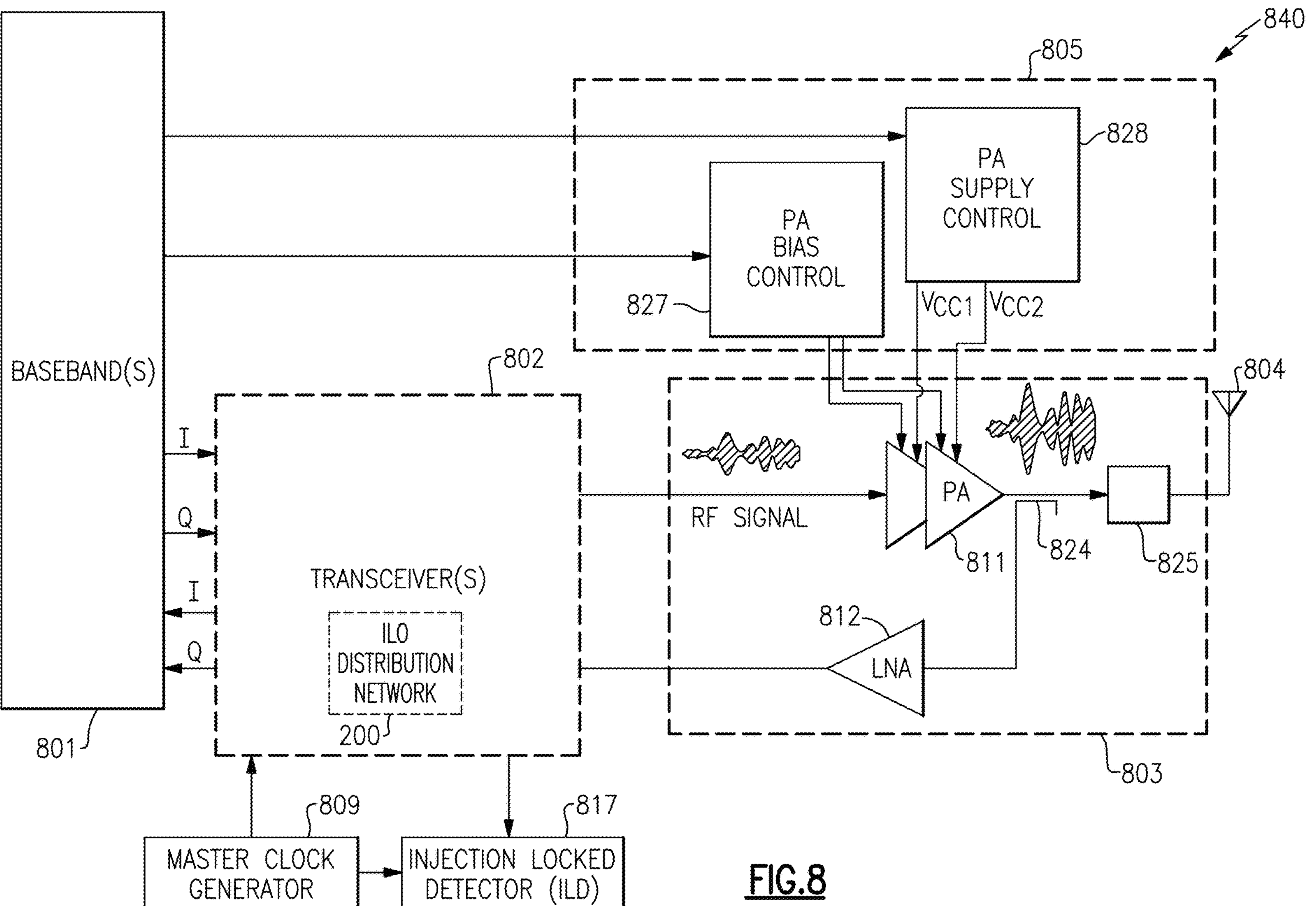
FIG. 8 is a schematic diagram of a power amplifier system according to one embodiment.

FIG. 8 is a schematic diagram of a power amplifier system 840 according to one embodiment. The illustrated power amplifier system 840 includes baseband(s) 801, transceiver(s) 802, front end(s) 803, antenna(s) 804, a power management system 805, a master clock generator 809, and an injection locked detector 817. The front end(s) 803 includes one or more power amplifier(s) (PAs) 811, a directional coupler 824, front-end circuitry 825, and low noise amplifier(s) (LNAs) 812. The power management system 805 includes a PA bias control circuit 827, and a PA supply control circuit 828.

Figure 9:
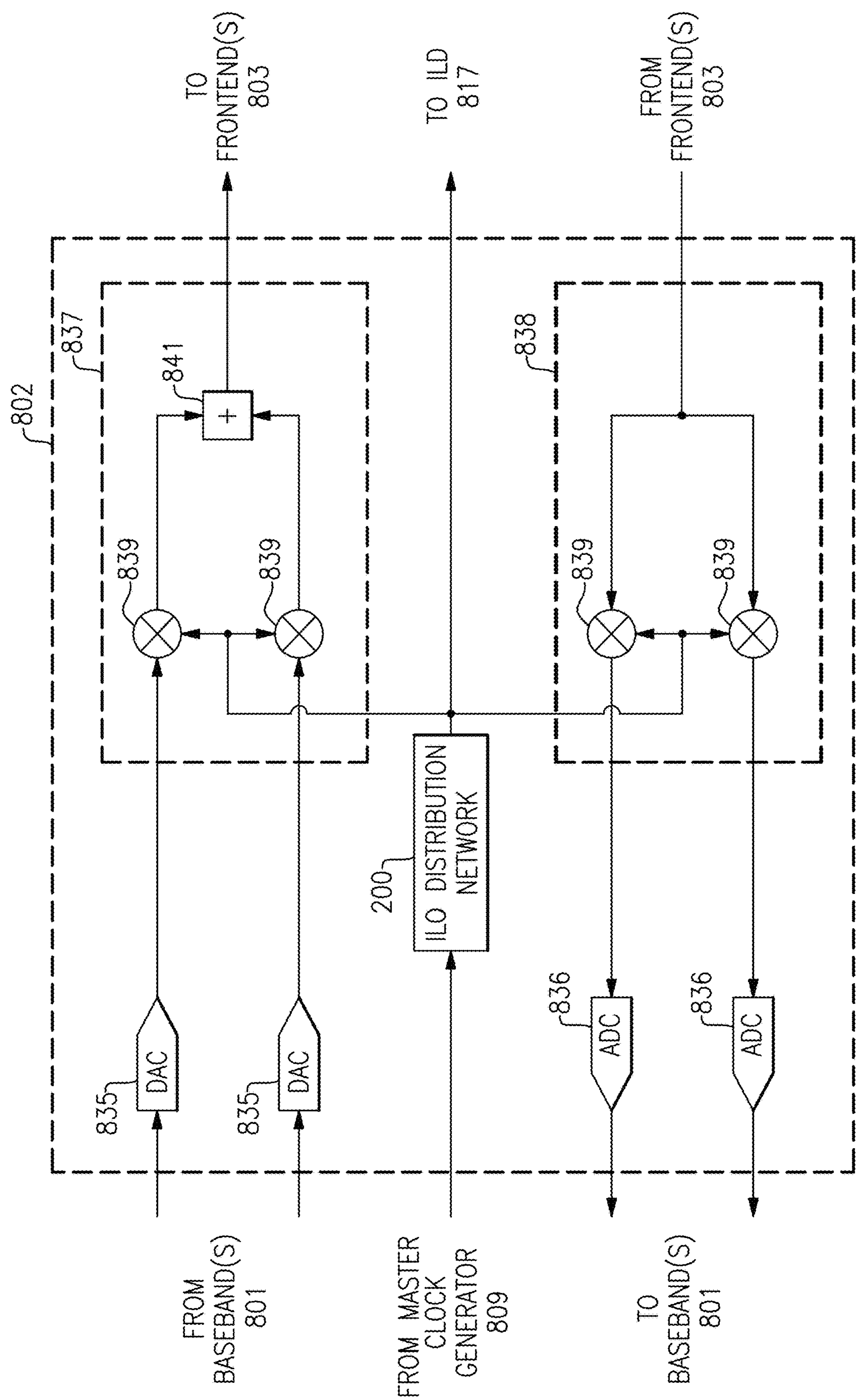
FIG. 9 is a schematic diagram of an example transceiver according to one embodiment.

FIG. 9 is a schematic diagram of an example transceiver 802 according to one embodiment. The illustrated transceiver 802 includes a pair of digital-to-analog converters (DACs) 835, a pair of analog-to-digital converter (ADCs) 836, an I/Q modulator 837, an I/Q mixer 838, and a local oscillator (LO) distribution network 200, which may include one or more LO distribution circuits (also referred to as LO distribution unit cells). The I/Q modulator 837 includes a pair of mixers 839 configured to receive I and Q signals from the DACs and a signal combiner 841 configured to receive output from the mixers 839. The I/Q mixer 838 includes a pair of mixers 839 configured to receive output from the front end(s) 802.

With continued reference to FIGS. 3 and 4, the baseband system(s) 801 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. As shown in FIG. 9, the I and Q signals can be provided to the I/Q modulator 837 in a digital format via the DACs 835. The baseband system(s) 801 can be implemented as any suitable processor(s) configured to process a baseband signal. For instance, the baseband system(s) 801 can include a digital signal processor, a microprocessor, a programmable core, or any combination thereof. Moreover, in some implementations, two or more baseband processors can be included in the baseband system(s) 801.

The I/Q modulator 837 can be configured to receive the I and Q signals from the baseband processor 821 and to process the I and Q signals to generate an RF signal, which is then provided to the front end(s) 902. For example, the I/Q modulator 837 can include the mixers 839 for upconverting the I and Q signals to RF, and the signal combiner 841 for combining the upconverted I and Q signals into an RF signal suitable for amplification by the power amplifier(s) 811 of the front end(s) 803. In certain implementations, the I/Q modulator 837 can include one or more filters (not illustrated) configured to filter frequency content of signals processed therein.

The power amplifier 823 can receive the RF signal from the I/Q modulator 837, and when enabled can provide an amplified RF signal to the antenna 804 via the front-end circuitry 825. The front-end circuitry 825 can be implemented in a wide variety of ways. In one example, the front-end circuitry 825 includes one or more switches, filters, duplexers, multiplexers, and/or other components. In another example, the front-end circuitry 825 is omitted in favor of the power amplifier 811 providing the amplified RF signal directly to the antenna 804.

The directional coupler 824 is configured to sense an output signal of the power amplifier 811. Additionally, the sensed output signal from the directional coupler 824 is provided to the I/Q mixer 838, which is configured to multiply the sensed output signal by a reference clock signal having a controlled frequency, the reference clock signal being received at the I/Q mixer 838 from the LO distribution network 200. As will be described in more detail later, one or more local oscillators (LOs) may be included in the LO distribution network 200 to provide the controlled frequency to each of the I/Q modulator 837 and the I/Q mixer 838. The I/Q mixer 838 is configured to generate a downshifted signal by downshifting the sensed output signal's frequency content, which is received from the front end(s) 803. The downshifted signal can be provided to the ADCs 836, which can convert the downshifted signal to a digital format suitable for processing by the baseband system(s) 801. Including a feedback path from the output of the power amplifier 811 to the baseband system(s) 801 can provide a number of advantages. For example, implementing the baseband system(s) 801 in this manner can aid in providing power control, compensating for transmitter impairments, and/or in performing digital pre-distortion (DPD). Although one example of a sensing path for a power amplifier is shown, other implementations are possible.

The PA supply control circuit 828 receives a power control signal from the baseband system(s) 801, and controls supply voltages of the power amplifier(s) 811. In the illustrated configuration, the PA supply control circuit 828 generates a first supply voltage $V_{CC1}$ for powering an input stage of the power amplifier(s) 811 and a second supply voltage $V_{CC2}$ for powering an output stage of the power amplifier(s) 811. The PA supply control circuit 828 can control the voltage level of the first supply voltage $V_{CC1}$ and/or the second supply voltage $V_{CC2}$ to enhance the power amplifier system's power added efficiency (PAE). The PA supply control circuit 828 can employ various power management techniques to change the voltage level of one or more of the supply voltages over time to improve the power amplifier's PAE, thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 828 is a multi-mode supply control circuit that can operate in multiple supply control modes including an APT mode and an ET mode. For example, the power control signal from the baseband system(s) 801 can instruct the PA supply control circuit 828 to operate in a particular supply control mode.

As shown in FIG. 8, the PA bias control circuit 827 receives a bias control signal from the baseband system(s) 801, and generates bias control signals for the power amplifier 811. In the illustrated configuration, the bias control circuit 827 generates bias control signals for both an input stage of the power amplifier 811 and an output stage of the power amplifier 811. However, other implementations are possible.

Introduction to the Use of Injection-Locked Oscillators in Transceiver Arrays

In certain cellular communication technologies, such as the 5G standard, a plurality of antennas 804 may be used to transmit and receive signals to/from a cell base station (e.g., the macro cell base station 1 and/or the small cell base station 3 of FIG. 1B). In certain implementations, the user equipment may include 64 individual element antennas 804, each of which may be operatively coupled to a separate transceiver path. Each transceiver path can include a corresponding front end 803 and transceiver 802. However, the user equipment can be implemented to include more or fewer antennas 804 and/or transceiver paths in other embodiments. The use of multiple antennas 804 may be an important aspect to enable RF communication at higher frequencies, for example, at frequencies above 6 GHz. For example, the use of multiple antennas 804 may be used to implement communication at 6 GHz or higher, and certain implementations may use 64 antennas 804 to communicate at 28 GHz.

As is discussed above in connection with FIGS. 3 and 4, the transceiver path between the baseband system(s) 801 and the front end(s) 803 may involve mixing the transmitted/received RF signal with a reference clock signal. In implementations with multiple antennas, each RF signal received/transmitted through one of the antennas is separately mixed with a reference signal. Thus, to implement a multiple antenna signal, the reference clock signal is distributed to each of the transceiver paths to be provided to the mixers (e.g., the mixers 839 illustrated in FIG. 9). In systems having multiple transceiver paths, the generation and routing of the reference clock signal may be complex, and may introduce challenges such as reducing/minimizing delay along the reference clock signal path. Additionally, using a number of separate clock generators may increase the size and complexity in implementing the transceiver paths within the user equipment.

Aspects of this disclosure relate to systems and techniques which can be used to address one or more of the above challenges in multiple antenna RF communication systems. In certain implementations, the LO distribution network 200 may comprise one or more injection-locked oscillators (ILOs) to generate the reference clock signals. In comparison to other oscillator circuits, ILOs may have a relatively simple architecture, thereby reducing the space required to generate the reference clock signals.

One potential design consideration of ILOs is that an ILO may not generate a reference clock signal having the desired frequency when ILO is not operating in an injection-locked region. In addition, in some applications, the transceiver path may produce unwanted out-of-band emissions if injection locking is not maintained. An ILO's free-running frequency (e.g., the frequency of the ILO without application of a control voltage) may be affected by changes in the external environment, such as variations in temperature, leading to unwanted variation in the ILO's frequency. Other external circuit conditions such as frequency pulling by load variation and/or frequency pushing caused by power supply voltage variation can also lead to erratic behavior in an ILO. In some implementations, oscillators used for injection locking may exploit low Q circuits to maximize the locking range, which can increase the chance of the ILO drifting out of lock.

One aspect of this disclosure includes systems and methods for detecting whether an ILO is injection-locked (e.g., whether the ILO is operating in an injection-locked region). Thus, aspects of this disclosure relate to an ILO lock detection circuit (also referred to as an injection locked detector), which can be used to detect whether an ILO is injection-locked. In certain implementations, the injection locked detector has a relatively simple architecture, reducing the overall complexity of the transceiver path compared to a more complex injection locked detector.

Certain techniques for determining whether an ILO is injection locked include examining the ILO's frequency spectrum. Using these techniques, a non-symmetrical sideband distribution may indicate that the ILO is out of lock (e.g., is out of an injection-locked region). While these techniques may be suitable for laboratory testing, they may be too complicated to be implemented on certain RF communication devices, such as a sensor, due to the required space and circuitry required to implement the detection techniques.

Other approaches for lock detection can include feeding the injection-locked oscillator signal (e.g., the output clock signal from the ILO) and an injection-locking signal (e.g., which may be a master clock signal supplied as an input to the ILO) to a mixer circuit to determine if a zero beat frequency is present. These approaches may require the additional mixer component to operate at millimeter-wave frequencies and may also require that both the injection-locked oscillator signal and injection-locking signals are available to be presented to the mixer. In certain implementations, a directional coupler and/or circulator may be used to provide these signals to the additional mixer. However, these approaches add complexity (e.g., by including a directional coupler and/or circulator) which negates some of the advantages achieved through the use of injection-locked oscillators having simplified architecture.

Distribution of ILO Clock Signals

FIG. 10 is a block diagram of an example ILO distribution network 200 according to one embodiment. The ILO distribution network 200 can be included within the transceiver(s) 802 as illustrated, for example, in FIG. 9. The ILO distribution network 200 includes a plurality of ILO distribution circuits 201A, 201B, . . . , 201D, each of which receives a master clock signal from the master clock generator 809. Although three ILO distribution circuits 201A, 201B, . . . , 201D are illustrated in FIG. 10, more or fewer ILO distribution circuits 201A, 201B, . . . , 201D may be included in other implementations.

Each of the ILO distribution circuits 201A, 201B, . . . , 201D is further configured to provide a reference clock signal to one or more corresponding mixers (e.g., the mixers 839 of FIG. 9) and an output signal to an injection locked detector (ILD) 817. Additionally, as shown in FIG. 10, the master clock generator 809 may be configured to receive a reference frequency signal FREF as an input which can be used to generate the master clock signal.

Figure 11:
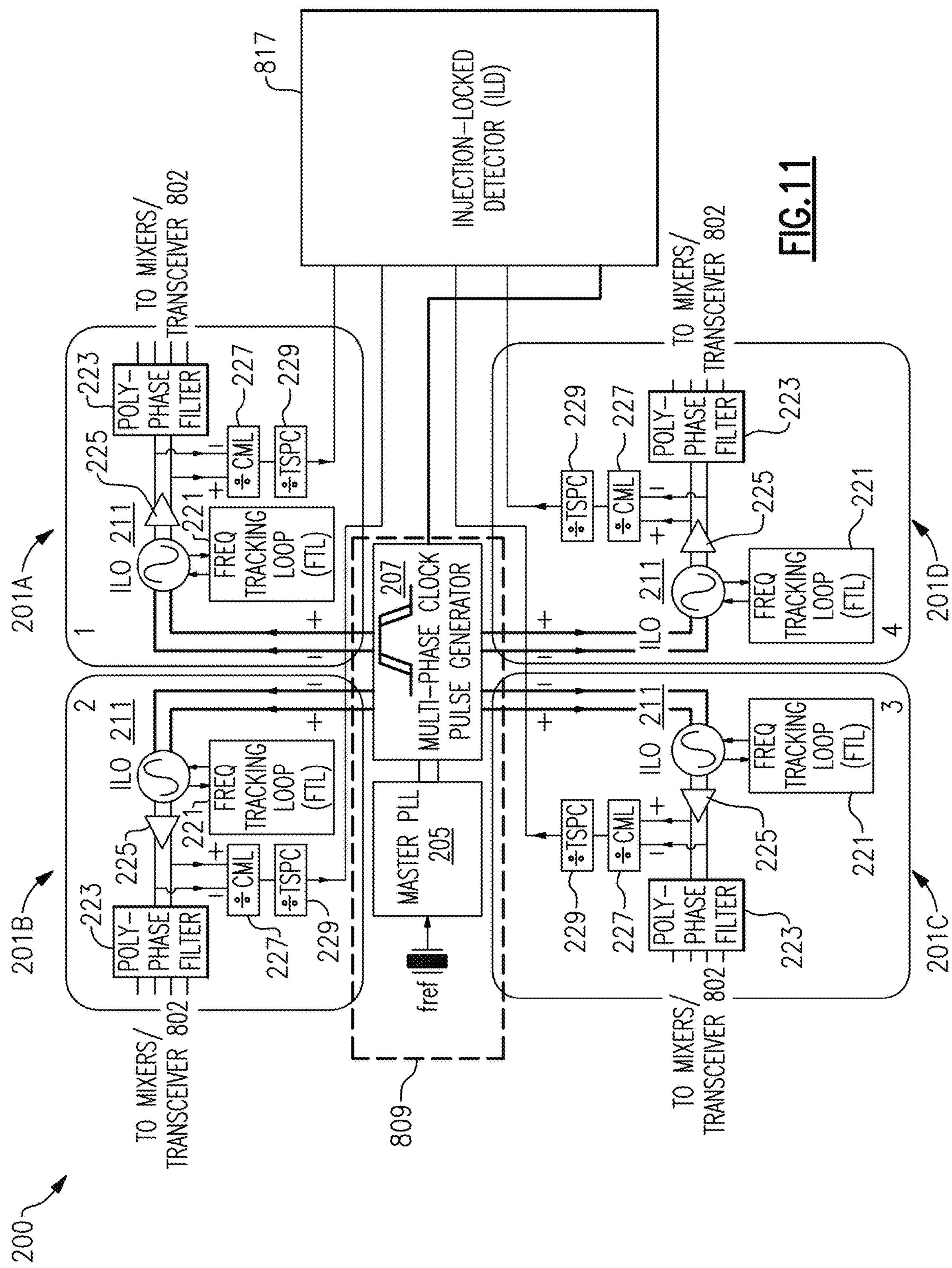
FIG. 11 is a schematic diagram of another example ILO distribution network according to one embodiment.

FIG. 11 is a schematic diagram of another example ILO distribution network 200 according to one embodiment. As shown in FIG. 11, the ILO distribution network 200 includes four ILO distribution circuits 201A, 201B, 201C, and 201D, each of which is configured to receive a master clock signal from a master clock generator 809. Although three ILO distribution circuits 201A, 201B, 201C, and 201D are illustrated in FIG. 10, more or fewer ILO distribution circuits 201A, 201B, 201C, and 201D may be included in other implementations. Additionally, a plurality of the individual ILO distribution networks 200 illustrated in FIG. 11 may be included in a single user equipment. For example, when the user equipment includes 64 antennas, the user equipment may include 16 of the ILO distribution networks 200.

The master clock generator may include a master phase-locked loop (PLL) 205 and a multi-phase clock pulse-generator 207. The master PLL 205 is configured to receive a reference frequency signal FREF as an input and generate an output signal having a phase that is clocked to the phase of the reference frequency signal FREF. The multi-phase clock pulse-generator 207 receives the output signal from the master PLL 205 and generates a master signal, which is provided to each of the ILO distribution circuits 201A, 201B, 201C, and 201D.

Each of the ILO distribution circuits 201A, 201B, 201C, and 201D may have a substantially similar construction, and thus, only one of the ILO distribution circuits 201A, 201B, 201C, and 201D will be described as representative. In particular, the ILO distribution circuit 201A includes an ILO 211, a frequency tracking loop 221, a poly-phase filter 223, an amplifier 225, current mode logic (CML) 227, and a true single-phase clock (TSPC) divider 229. The ILO 221 is configured to receive the master clock signal from the master clock generator 809 and generate a reference clock signal which is supplied to the mixers 839 used in the transceiver path (e.g., within the power amplifier system 840 of FIG. 8). The ILO 221 can use the master clock signal as an input and generate a higher frequency reference clock signal at the frequency required by the mixers 839. Since the ILO 221 is configured to use the master clock signal as an injection input, the master clock signal may also be referred to as an injection clock signal.

The frequency tracking loop (FTL) 221 is formed in a closed loop with the ILO 211 and is configured to determine the frequency of the ILO 211. Specifically, the FTL 221 may receive an output from the ILO 221 and provide a feedback signal to the ILO 211 to form a closed loop. The amplifier 225 is configured to amplify the injection-locked oscillator signal output from the ILO before supplying the amplified signal to the poly-phase filter 223 and the CML divider 227. The poly-phase filter 223 may filter certain extraneous frequencies from the amplified injection-locked oscillator signal before providing the resulting reference clock signal to the mixers 839.

The output signal provided to the ILD 817 may be indicative of the operating frequency of the corresponding ILO 211. The ILO distribution circuits 201A may be configured to generate the output signal by down-converting the reference clock to the frequency of the master clock signal. In the embodiment of FIG. 11, the CIVIL divider 227 and TSPC divider 229 may function together to generate the output signal. For example, the CML divider 227 and TSPC divider 229 may divide the injection-locked oscillator signal down to substantially the same frequency as the master clock signal. The divided clock signal is then output to the ILD 817.

Figure 12:
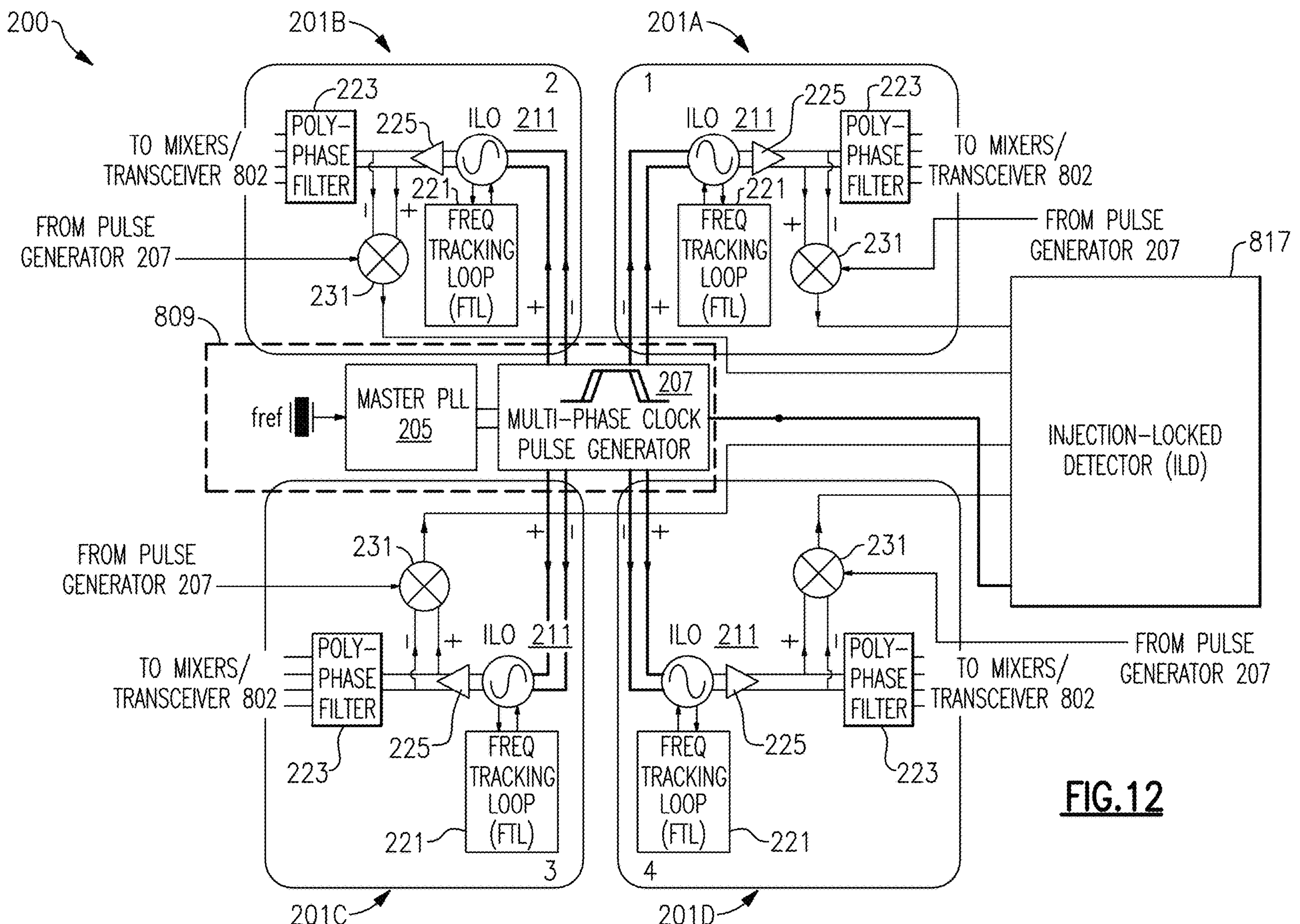
FIG. 12 is a schematic diagram of yet another example ILO distribution network according to one embodiment.

FIG. 12 is a schematic diagram of yet another example ILO distribution network 200 according to one embodiment. Since the embodiment of FIG. 12 is similar to that of FIG. 11, certain elements of FIG. 12 which are the same as or similar to those of FIG. 11 may not be described in detail. With reference to FIG. 12, in place of the CIVIL divider 227 and TSPC divider 229, the ILO distribution circuit 201A includes a mixer 231. The mixer 231 may be implemented as a subharmonic mixer. The mixer 231 is configured to receive both the injection-locked oscillator signal from the amplifier 225 and the master clock signal from the multi-phase clock pulse generator 207 of the master clock generator 809. The mixer 231 is also configured to generate a downshifted signal by downshifting the injection-locked oscillator signal by the master clock signal. The mixer 231 provides the downshifted injection-locked oscillator signal to the ILD 817.

Figure 13:
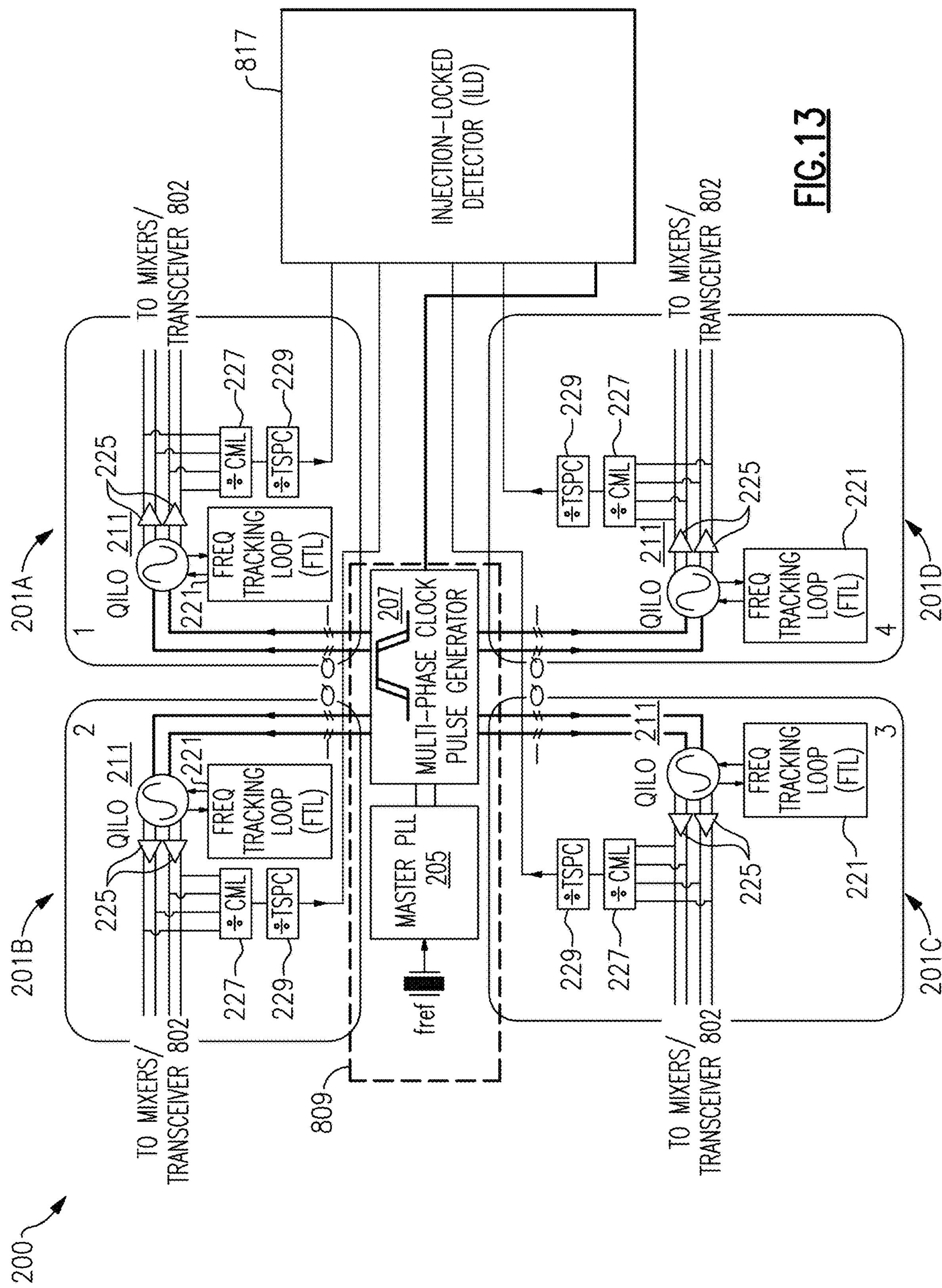
FIG. 13 is a schematic diagram of still yet another example ILO distribution network according to one embodiment.

FIG. 13 is a schematic diagram of still yet another example ILO distribution network 200 according to one embodiment. In the embodiment of FIG. 13, the ILO 221 is implemented as a quadrature ILO which is configured to provide quadrature ILO distribution. In the illustrated implementation, the multi-phase clock pulse-generator 207 is configured to provide the master clock signal in the format of an in-phase (I) signal and a quadrature-phase (Q) signal, each of which is provided to the ILO distribution circuits 201A, 201B, 201C, and 201D. The remaining components of the ILO distribution circuits 201A, 201B, 201C, and 201D may function in a similar fashion to the ILO distribution circuits 201A, 201B, 201C, and 201D of FIG. 11. The ILO distribution circuit 201A of FIG. 13 includes similar CML divider 227 and TSPC divider 229 components to the implementation of FIG. 11.

Figure 14:
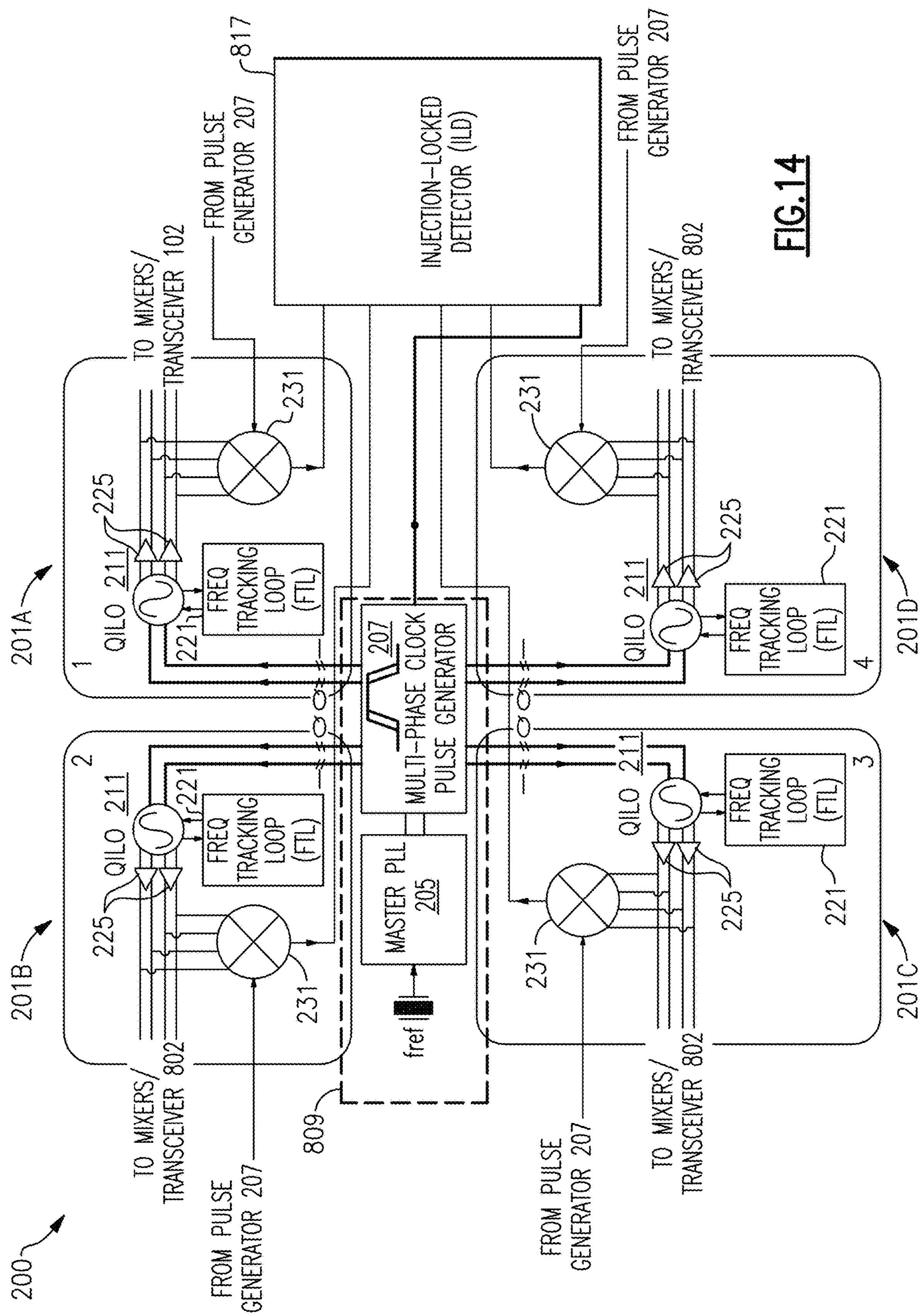
FIG. 14 is a schematic diagram of another example ILO distribution network according to one embodiment.

FIG. 14 is a schematic diagram of another example ILO distribution network 200 according to one embodiment. In the example of FIG. 14, the QILO implementation of FIG. 13 is combined with the subharmonic mixer 231 implementation of FIG. 12. The remaining components may be similar to those discussed in connection with FIG. 11.

Example ILD Structure and Functionality

Figure 15:
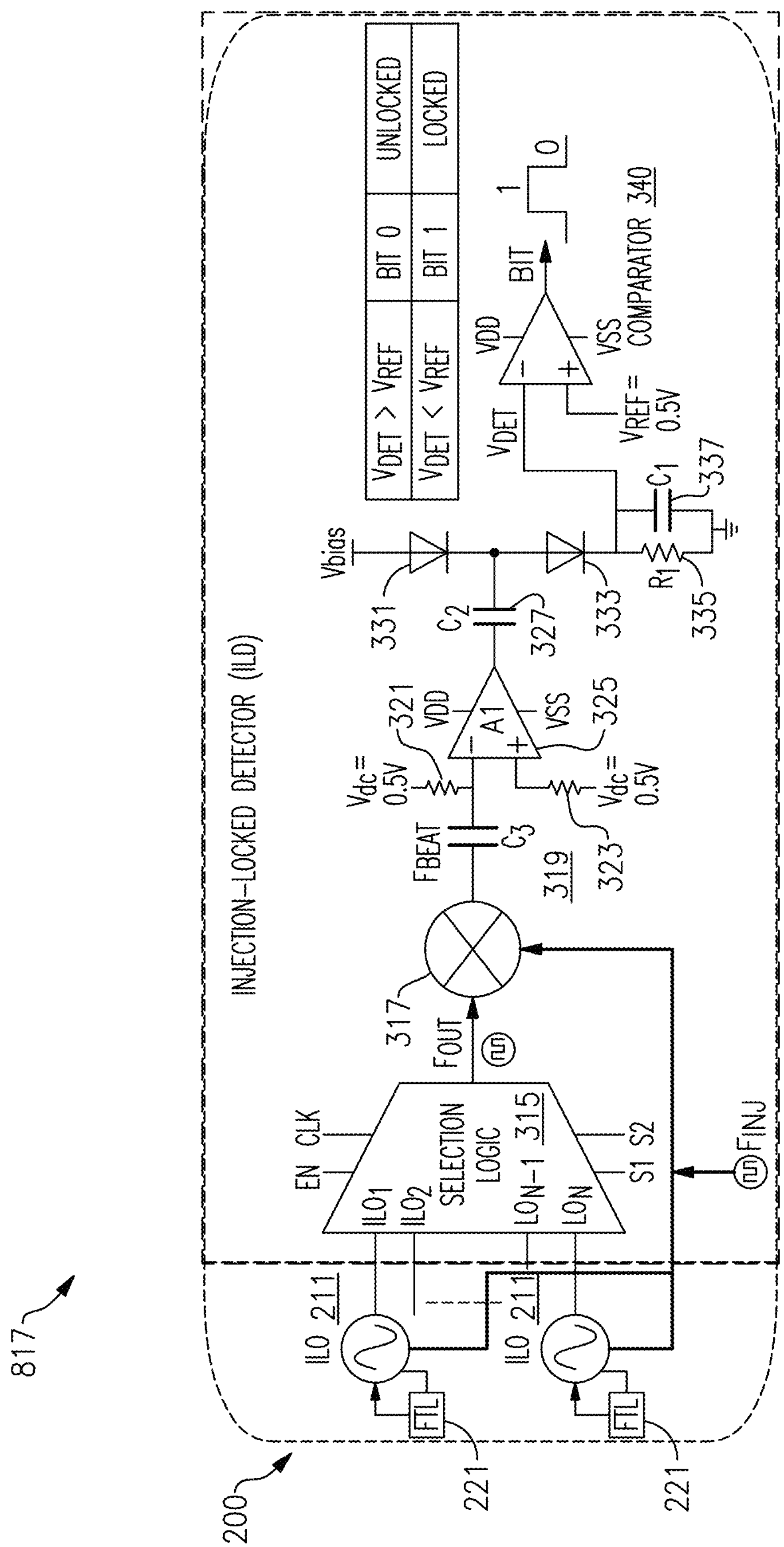
FIG. 15 is a schematic diagram of an example injection locked detector (ILD) according to one embodiment.

In each of the embodiments of FIGS. 6-9, the output of each of the ILO distribution circuits 201A, 201B, 201C, and 201D may be provided to an ILD 817 which is configured to determine whether each of the ILOs 211 is operating in an injection-locked region. FIG. 15 is a schematic diagram of an example ILD 817 according to one embodiment. The ILD 817 is configured to receive the output reference clock signals from each of the ILOs 211 of the ILO distribution network 200. Although the full ILO distribution network 200 is not illustrated in FIG. 15, the ILO distribution network 200 may include additional components, for example, as illustrated in the embodiments of FIGS. 6-9.

The ILD 817 includes selection logic 315, a mixer 317, a plurality of capacitors 319, 327, and 337, a plurality of resistors 321, 323, and 335, two comparators 325 and 340, and two diodes 331 and 333. The selection logic 315 may select the input received from one of the ILOs 211 as an output $F_{OUT}$ to be provided to the mixer 317. In certain embodiments, the selection logic 315 may be implemented as a multiplexor. The mixer 317 combines the selected output $F_{OUT}$ of the selection logic and the master clock signal $F_{INJ}$ to produce an intermediate mixed signal $F_{BEAT}$ which is provided to the capacitor 319. When the selected output $F_{OUT}$ of the selection logic is not the same as the master clock signal $F_{INJ}$, the intermediate mixed signal $F_{BEAT}$ may have a non-zero frequency (e.g., may have the form of a beat signal indicating that the selected ILO 211 is in an unlocked state). Alternatively, when the selected output $F_{OUT}$ of the selection logic is substantially the same as the master clock signal $F_{INJ}$, the intermediate mixed signal $F_{BEAT}$ may have a frequency of about zero (e.g., indicating that the selected ILO 211 is in a locked state).

The combination of components including the capacitors 319, 327, and 337, the resistors 321, 323, and 335, the comparator 325, and the two diodes 331 and 333 may be configured to generate an intermediate voltage $V_{DET}$ which is indicative of whether the intermediate mixed signal $F_{BEAT}$ has a non-zero frequency. For example, when a beat signal is present in the output of the mixer 317, the intermediate mixed signal $F_{BEAT}$ is passed through the capacitor $C_3$ to the comparator 325 and is rectified by a diode network include diodes 331 and 333. The intermediate mixed signal $F_{BEAT}$ is then smoothed by a low-pass filter formed by resistor 335 and capacitor 337 and fed to the inverting input of the comparator 340.

The intermediate voltage $V_{DET}$ is compared with a reference voltage $V_{REF}$ by the comparator 340 to provide an output value BIT which indicates whether the selected ILO 211 is in an unlocked or locked state. In this case, when the intermediate voltage $V_{DET}$ is greater than the reference voltage $V_{REF}$ and the comparator 340 output goes low to indicate that the corresponding ILO 221 is not in a locked condition. When the no beat signal is present on the intermediate mixed signal $F_{BEAT}$ and $V_{DET}$ is less than the reference voltage $V_{REF}$, the comparator 340 produces a high output indicating that the ILO is in a locked condition.

The embodiment of the ILD 817 illustrated in FIG. 15 can provide fully integrated solution to the detection of whether one or more ILOs 211 is in a locked condition. In contrast, other solutions to determining whether an ILO 211 is in a locked condition may use large-sized lumped components, which are suitable for laboratory testing only and cannot be integrated into a user equipment efficiently. Aspects of this disclosure, such as the ILO 817 of FIG. 15 also use low power consumption and have a compact die area compared to laboratory testing implementations.

The use of an ILO 211, which has a simple design, can be implemented for a large range of frequencies of operation, including the frequencies used for 5G (e.g., frequencies in the range of 6 GHz to 30 GHz). ILOs 221 and the ILD 817 have fast response times, such that the ILD 817 can set the output bit BIT low as soon as ILO 221 is detected as going out of a locked condition due to PVT variations. In certain implementations, the average settling time for the output bit BIT in the ILD 817 is less than 1 μs. At least these features make the use of an ILD 817 in combination with an ILO distribution network 200 desirable for implementation on a large array transceivers system.

Figure 16:
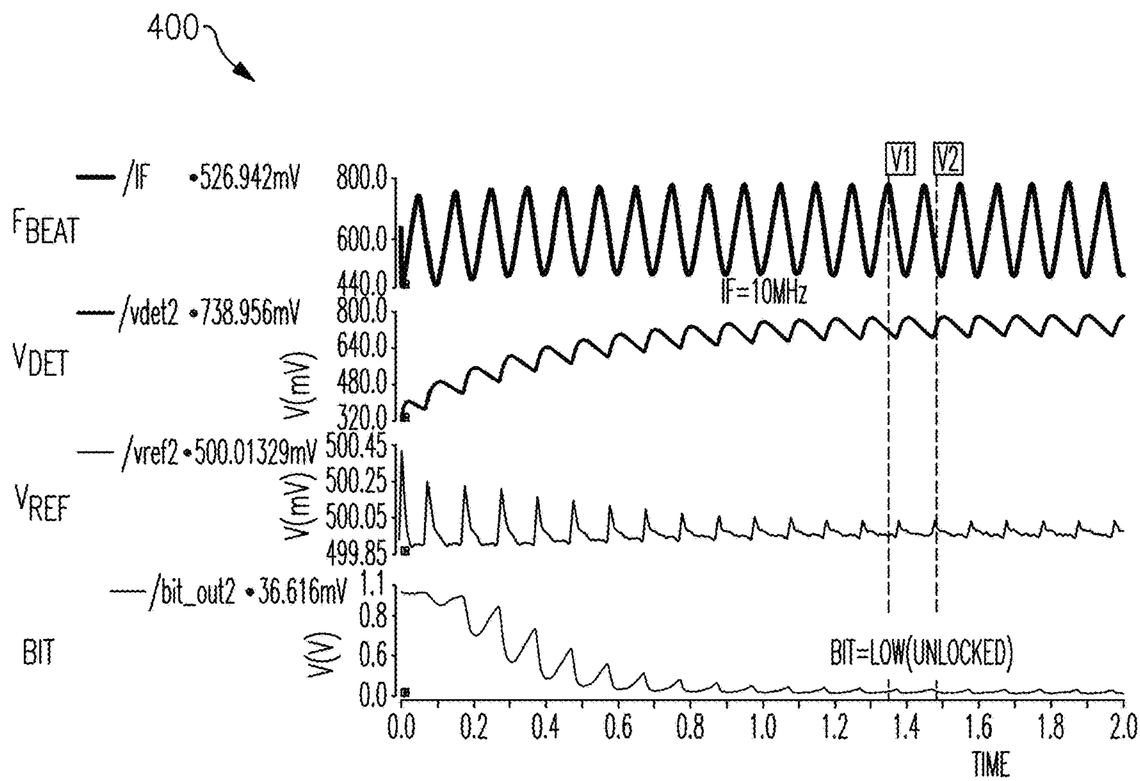
FIG. 16 is a graph of example values output from certain components of the ILD when a selected ILO is in an unlocked state according to one embodiment.

FIG. 16 is a graph 400 of example values output from certain components of the ILD 817 when a selected ILO 211 is in an unlocked state according to one embodiment. The graph 400 includes the voltages for the intermediate mixed signal $F_{BEAT}$, the intermediate voltage $V_{DET}$, the reference voltage $V_{REF}$, and the output value BIT in response to a new ILO 211 being selected by the selection logic. As shown in FIG. 16, when the ILO 211 is in an unlocked state, the intermediate mixed signal $F_{BEAT}$ has a non-zero frequency. Due to electromagnetic coupling of the components in the ILD 817, the values for the intermediate voltage $V_{DET}$, the reference voltage $V_{REF}$, and the output value BIT take a certain amount of time to settle to more stable values as shown at the end of the graph 400. After a certain amount of time, the output value settles to a value of zero, indicating that the selected ILO 211 is unlocked.

Figure 17:
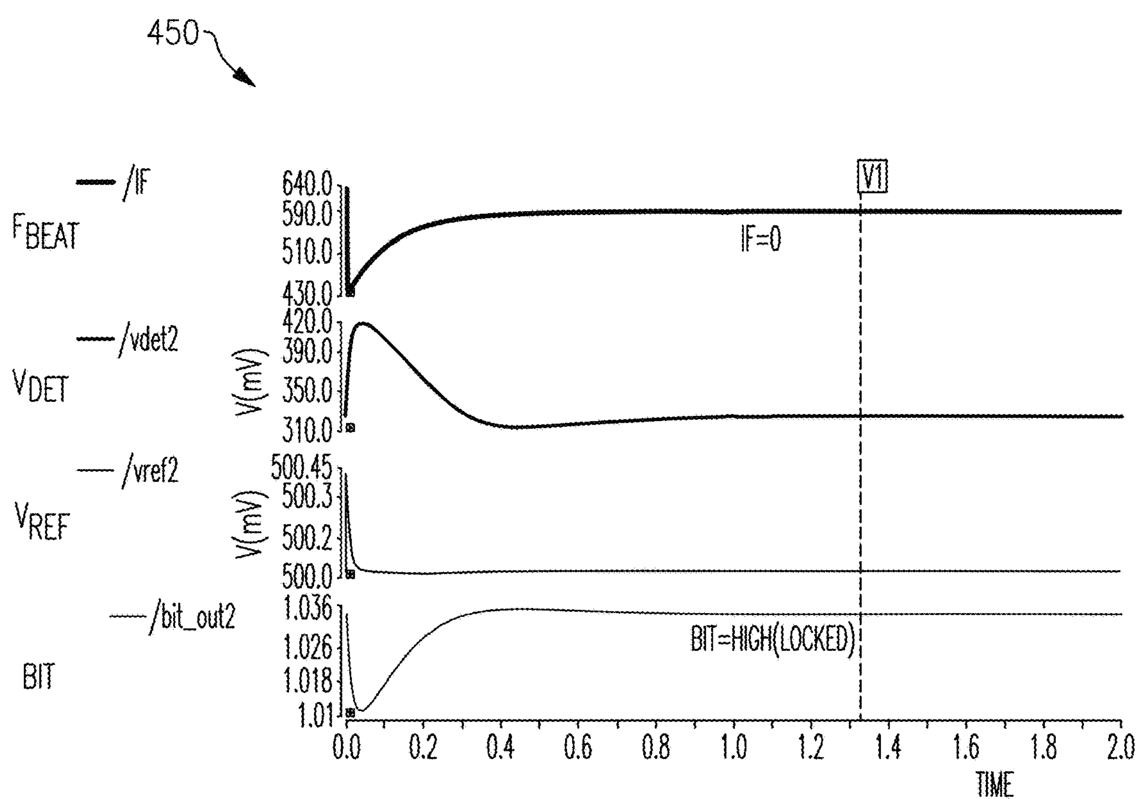
FIG. 17 is a graph of example values output from certain components of the ILD when a selected ILO is in a locked state according to one embodiment.

FIG. 17 is a graph 450 of example values output from certain components of the ILD 817 when a selected ILO 211 is in a locked state according to one embodiment. The graph 450 includes the voltages for the intermediate mixed signal $F_{BEAT}$, the intermediate voltage $V_{DET}$, the reference voltage $V_{REF}$, and the output value BIT in response to a new ILO 211 being selected by the selection logic. As shown in FIG. 17, when the ILO 211 is in a locked state, the intermediate mixed signal $F_{BEAT}$ has a frequency of about zero. After a certain amount of time, the output value settles to a value of one, indicating that the selected ILO 211 is locked.

Example Multi-Phase Clock Pulse Generator

Figure 18:
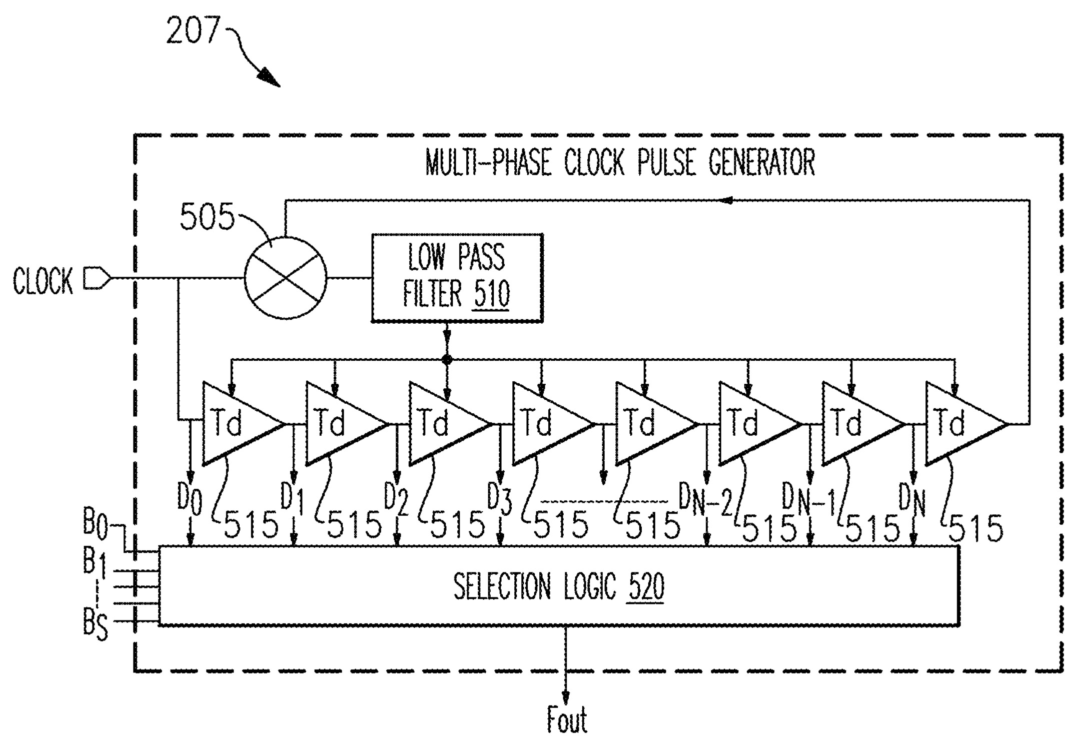
FIG. 18 is a schematic diagram of an example multi-phase clock pulse generator according to one embodiment.

FIG. 18 is a schematic diagram of an example multi-phase clock pulse generator 207 according to one embodiment. The multi-phase clock pulse generator 207 may be configured to generate the master clock signal having substantially the same frequency as the input clock (e.g., received from the master PLL 205) and having an adjustable phase. In certain implementations, the multi-phase clock pulse generator 207 may select the phase of the master clock signal based on signal delay between the ILO distribution network 200 and the mixers 839. For example, when the user equipment includes a plurality of ILO distribution networks 200, the delay between the ILO distribution networks 200 and the corresponding mixers 839 may vary, and thus, the phase of the master clock signal as selected by the multi-phase clock pulse generator 207 can compensate for the delay variations.

With continued reference to FIG. 18, the multi-phase clock pulse generator 207 includes a mixer 505, a low pass filter 510, a set of delay elements 515, and selection logic 520. The mixer 505 receives the input clock from the master PLL 205 and the output from the last delay element 515. The low pass filter 510 receives the output signal from the mixer 505 and outputs the filtered signal to each of the delay elements 515. The selection logic 520 selects the output $D_0$, $D_1$, $D_N$ from one of the delay elements 515 and provides the selected output $D_0$, $D_1$, $D_N$ as the output $F_{OUT}$ of the multi-phase clock pulse generator 207. Thus, the multi-phase clock pulse generator 207 can select an amount of output to be added to the input clock signal by selecting the number of delay elements 515 through which the clock signal Clock is routed before being output by the multi-phase clock pulse generator 207.

Figure 19:
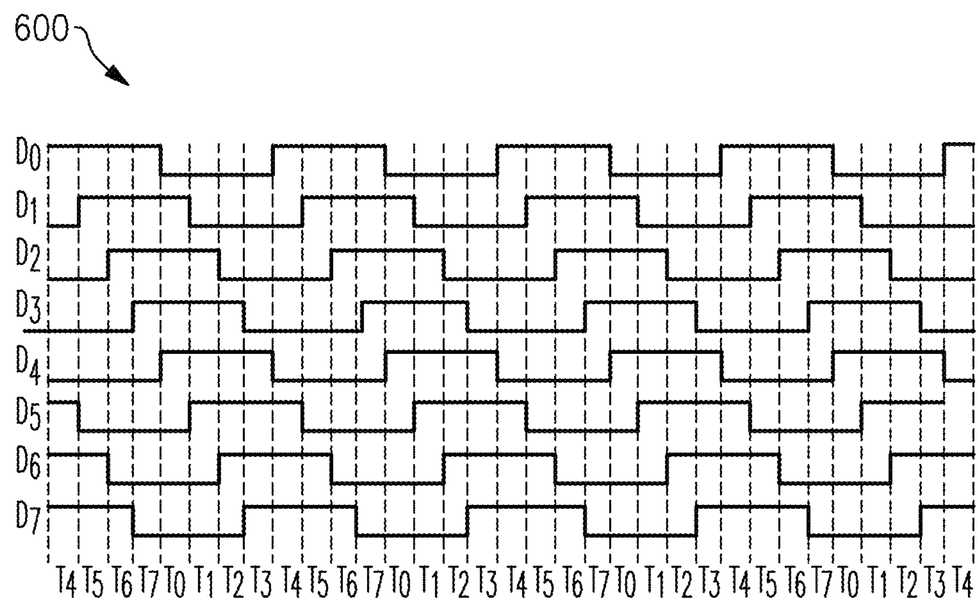
FIG. 19 is a graph 600 of example values output from the delay elements 515 of the multi-phase clock pulse generator 207 according to one embodiment.

FIG. 19 is a graph 600 of example values output from the delay elements 515 of the multi-phase clock pulse generator 207 according to one embodiment. Specifically, in the illustrated embodiment, the multi-phase clock pulse generator 207 may include eight delay elements 515 respectively having eight delay outputs $D_0$, $D_1$, . . . $D_7$. FIG. 19 also illustrates the difference between the phases of adjacent delay outputs, for example, the phases of delay outputs $D_0$ and $D_1$ differ by a time period $T_0$. When each of the delay elements 515 is configured to delay the include clock signal by the same amount, the difference between the phases of each of the adjacent delay outputs $D_0$, $D_1$, . . . $D_7$ may be substantially the same. The selection logic 520 is configured to select any of the delay output $D_0$, $D_1$, $D_N$ as the output $F_{OUT}$ of the multi-phase clock pulse generator 207.

Numbered Embodiments

Several numbered embodiments of the subject matter described herein are provided below.

1. An injection-locked oscillator distribution system, comprising:

a master clock generator configured to generate a master clock signal;

an injection-locked oscillator distribution circuit including an injection-locked oscillator and configured to receive the master clock signal, the injection-locked oscillator configured to generate a reference clock signal based on the master clock signal, the injection-locked oscillator distribution circuit further configured to generate an output signal indicative of an operating frequency of the injection-locked oscillator; and an injection-locked detector configured to receive the master clock signal and the output signal, the injection-locked detector further configured to determine whether the injection-locked oscillator is in a locked state or in an unlocked state based on the master clock signal and the output signal.

2. The injection-locked oscillator distribution system of embodiment 1 wherein injection-locked oscillator is further configured to generate the reference clock signal having a higher frequency than the master clock signal and the injection-locked oscillator distribution circuit is further configured to generate the output signal via down-converting the reference clock signal to a frequency of the master clock signal.

3. The injection-locked oscillator distribution system of embodiment 2 wherein the injection-locked oscillator distribution circuit further includes a mixer configured to generate the output signal.

4. The injection-locked oscillator distribution system of embodiment 2 wherein the injection-locked oscillator distribution circuit further includes divider circuitry configured to generate the output signal.

5. The injection-locked oscillator distribution system of embodiment 1 wherein the injection-locked detector includes a mixer configured to mix the output signal with the master clock signal to generate an intermediate mixed signal, the injection-locked detector further configured to determine whether the injection-locked oscillator is in the locked state or in the unlocked state based on the intermediate mixed signal.

6. The injection-locked oscillator distribution system of embodiment 5 wherein the injection-locked detector includes a low-pass filter configured to receive the intermediate mixed signal and generate an intermediate voltage, the injection-locked detector further including a comparator configured to compare the intermediate voltage to a reference voltage and output a signal indicative of whether the injection-locked oscillator is in the locked state or in the unlocked state based on the comparison of the intermediate voltage to the reference voltage.

7. The injection-locked oscillator distribution system of embodiment 1 further including an additional injection-locked oscillator distribution circuit, the injection-locked detector further including selection logic configured to select one of the output signal and an additional output signal from the additional injection-locked oscillator.

8. The injection-locked oscillator distribution system of embodiment 1 wherein the injection-locked oscillator distribution circuit is operatively coupled to a mixer of a transceiver circuit, the injection-locked oscillator distribution circuit is further configured to provide the reference clock signal to the mixer.

9. A method of detecting an injection-locked state, comprising:

generating, by a master clock generator, a master clock signal; receiving, at an injection-locked oscillator distribution circuit, the master clock signal, the injection-locked oscillator distribution circuit including an injection-locked oscillator;

generating, at the injection-locked oscillator, a reference clock signal based on the master clock signal;

generating, at the injection-locked oscillator distribution circuit, an output signal indicative of an operating frequency of the injection-locked oscillator;

receiving, at an injection-locked detector, the master clock signal and the output signal; and determining, by the injection-locked detector, whether the injection-locked oscillator is in a locked state or in an unlocked state based on the master clock signal and the output signal.

10. The method of embodiment 9 further comprising:

generating, at the injection-locked oscillator, the reference clock signal having a higher frequency than the master clock signal; and generating, at the injection-locked oscillator distribution circuit, the output signal via down-converting the reference clock signal to a frequency of the master clock signal.

11. The method of embodiment 10 further comprising generating the output signal at a mixer of the injection-locked oscillator distribution circuit.

12. The method of embodiment 10 further comprising generating the output signal at divider circuitry the injection-locked oscillator distribution circuit.

13. The method of embodiment 9 further comprising:

mixing, at a mixer included in the injection-locked detector, the output signal with the master clock signal to generate an intermediate mixed signal; and determining, at the injection-locked detector, whether the injection-locked oscillator is in the locked state or in the unlocked state based on the intermediate mixed signal.

14. The method of embodiment 13 further comprising:

generating, at a low-pass filter of the injection-locked detector, an intermediate voltage based on the intermediate mixed signal;

comparing, at a comparator of the injection-locked detector, the intermediate voltage to a reference voltage; and outputting, at the comparator, a signal indicative of whether the injection-locked oscillator is in the locked state or in the unlocked state based on the comparison of the intermediate voltage to the reference voltage.

15. The method of embodiment 9 further comprising selecting, at selection logic, one of the output signal and an additional output signal received from an additional injection-locked oscillator.

16. The method of embodiment 9 further comprising providing reference clock signal to a mixer of a transceiver circuit.

17. A mobile device, comprising:

an antenna;

a transceiver circuit operatively coupled to the antenna, the transceiver including a first mixer;

a master clock generator configured to generate a master clock signal;

an injection-locked oscillator distribution circuit including an injection-locked oscillator and configured to receive the master clock signal, the injection-locked oscillator operatively coupled to the first mixer and configured to generate a reference clock signal based on the master clock signal and provide the reference clock signal to the first mixer, the injection-locked oscillator distribution circuit further configured to generate an output signal indicative of an operating frequency of the injection-locked oscillator; and an injection-locked detector configured to receive the master clock signal and the output signal, the injection-locked detector further configured to determine whether the injection-locked oscillator is in a locked state or in an unlocked state based on the master clock signal and the output signal.

18. The mobile device of embodiment 17 wherein injection-locked oscillator is further configured to generate the reference clock signal having a higher frequency than the master clock signal and the injection-locked oscillator distribution circuit is further configured to generate the output signal via down-converting the reference clock signal to a frequency of the master clock signal.

19. The mobile device of embodiment 18 wherein the injection-locked oscillator distribution circuit further includes a second mixer configured to generate the output signal.

20. The mobile device of embodiment 18 wherein the injection-locked oscillator distribution circuit further includes divider circuitry configured to generate the output signal.

21. An injection-locked oscillator distribution system, comprising:

a master clock generator configured to generate a master clock signal;

a transceiver circuit including a plurality of mixers;

an injection-locked oscillator distribution circuit including a plurality of injection-locked oscillators, each of the injection-locked oscillators configured to receive the master clock signal, each of the injection-locked oscillators configured to generate a reference clock signal based on the master clock signal, each of the injection-locked oscillators configured to provide the reference clock signal to one of the mixers.

22. The injection-locked oscillator distribution system of embodiment 21 further including an additional injection-locked oscillator distribution circuit including a plurality of additional injection-locked oscillators, each of the additional injection-locked oscillators configured to generate the reference clock signal and provide the reference clock signal to one of the mixers.

23. The injection-locked oscillator distribution system of embodiment 21 wherein the master clock generator includes a master phase-locked loop and a multi-phase clock pulse-generator, the master phase-locked loop configured to receive a reference frequency signal as an input and generate an output signal having a phase that is clocked to the phase of the reference frequency signal, the multi-phase clock pulse-generator configured to receive the output signal from the master phase-locked loop, generate a master signal, and provide the master signal to the injection-locked oscillator distribution circuit.

24. The injection-locked oscillator distribution system of embodiment 21 wherein the injection-locked oscillator distribution circuit is further configured to generate an output signal indicative of an operating frequency of the injection-locked oscillator, the injection-locked oscillator distribution system further including an injection-locked detector configured to receive the master clock signal and the output signal, the injection-locked detector further configured to determine whether the injection-locked oscillator is in a locked state or in an unlocked state based on the master clock signal and the output signal.

25. The injection-locked oscillator distribution system of embodiment 24 wherein the injection-locked oscillator is further configured to generate the reference clock signal having a higher frequency than the master clock signal and the injection-locked oscillator distribution circuit is further configured to generate the output signal via down-converting the reference clock signal to a frequency of the master clock signal.

26. The injection-locked oscillator distribution system of embodiment 25 wherein the injection-locked oscillator distribution circuit further includes a mixer configured to generate the output signal.

27. The injection-locked oscillator distribution system of embodiment 25 wherein the injection-locked oscillator distribution circuit further includes divider circuitry configured to generate the output signal.

28. The injection-locked oscillator distribution system of embodiment 24 wherein the injection-locked detector includes a mixer configured to mix the output signal with the master clock signal to generate an intermediate mixed signal, the injection-locked detector further configured to determine whether the injection-locked oscillator is in the locked state or in the unlocked state based on the intermediate mixed signal.

29. A method of distributing a reference clock signal, comprising:

generating, by a master clock generator, a master clock signal;

receiving, at an injection-locked oscillator distribution circuit, the master clock signal, the injection-locked oscillator distribution circuit including a plurality of injection-locked oscillators;

generating, at each of the injection-locked oscillators, a reference clock signal based on the master clock signal; and providing the reference clock signal from each of the injection-locked oscillators to the mixers.

30. The method of embodiment 29 further comprising:

generating, at each of each of the additional injection-locked oscillators, the reference clock signal; and providing the reference clock signal from each of the additional injection-locked oscillators to the mixers.

31. The method of embodiment 29 further comprising:

receiving, at a master phase-locked loop of the master clock generator, a reference frequency signal as an input;

generating, at the master phase-locked loop, an output signal having a phase that is clocked to the phase of the reference frequency signal;

receiving, at a multi-phase clock pulse-generator of the master clock generator, the output signal from the master phase-locked loop;

generating, at the multi-phase clock pulse-generator a master signal; and providing the master signal to the injection-locked oscillator distribution circuit from the multi-phase clock pulse-generator.

32. The method of embodiment 29 further comprising:

generating, at the injection-locked oscillator distribution circuit, an output signal indicative of an operating frequency of the injection-locked oscillator, receiving, at an injection-locked detector of the injection-locked oscillator distribution system, the master clock signal and the output signal, determining, at the injection-locked detector, whether the injection-locked oscillator is in a locked state or in an unlocked state based on the master clock signal and the output signal.

33. The method of embodiment 32 further comprising:

generating, at the injection-locked oscillator, the reference clock signal having a higher frequency than the master clock signal; and generating, at the injection-locked oscillator distribution circuit, the output signal via down-converting the reference clock signal to a frequency of the master clock signal.

34. The method of embodiment 33 further comprising generating the output signal at a mixer of the injection-locked oscillator distribution circuit.

35. The method of embodiment 33 further comprising generating the output signal at divider circuitry the injection-locked oscillator distribution circuit.

36. The method of embodiment 32 further comprising:

mixing, at a mixer included in the injection-locked detector, the output signal with the master clock signal to generate an intermediate mixed signal; and determining, at the injection-locked detector, whether the injection-locked oscillator is in the locked state or in the unlocked state based on the intermediate mixed signal.

37. A mobile device, comprising:

an antenna;

a transceiver circuit operatively coupled to the antenna, the transceiver including a first mixer;

a master clock generator configured to generate a master clock signal;

a transceiver circuit including a plurality of mixers; and an injection-locked oscillator distribution circuit including a plurality of injection-locked oscillators, each of the injection-locked oscillators configured to receive the master clock signal, each of the injection-locked oscillators configured to generate a reference clock signal based on the master clock signal, each of the injection-locked oscillators configured to provide the reference clock signal to one of the mixers.

38. The mobile device of embodiment 37 further including an additional injection-locked oscillator distribution circuit including a plurality of additional injection-locked oscillators, each of the additional injection-locked oscillators configured to generate the reference clock signal and provide the reference clock signal to one of the mixers.

39. The mobile device of embodiment 37 wherein the master clock generator includes a master phase-locked loop and a multi-phase clock pulse-generator, the master phase-locked loop configured to receive a reference frequency signal as an input and generate an output signal having a phase that is clocked to the phase of the reference frequency signal, the multi-phase clock pulse-generator configured to receive the output signal from the master phase-locked loop, generate a master signal, and provide the master signal to the injection-locked oscillator distribution circuit.

40. The mobile device of embodiment 37 wherein the injection-locked oscillator distribution circuit is further configured to generate an output signal indicative of an operating frequency of the injection-locked oscillator, the injection-locked oscillator distribution system further including an injection-locked detector configured to receive the master clock signal and the output signal, the injection-locked detector further configured to determine whether the injection-locked oscillator is in a locked state or in an unlocked state based on the master clock signal and the output signal.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A clock distribution system for a radiofrequency system, the clock distribution system comprising:

a clock generator configured to generate a master clock signal;

a first injection-locked oscillator distribution circuit including a first injection-locked oscillator and configured to receive the master clock signal and generate a first reference clock signal based on the master clock signal;

a second injection-locked oscillator distribution circuit including a second injection-locked oscillator and configured to receive the master clock signal and generate a second reference clock signal based on the master clock signal; and a lock detector circuit configured to determine whether the first injection-locked oscillator is in a locked or unlocked state based on the master clock signal and a first output signal from the first injection-locked oscillator distribution circuit, and further configured to determine whether the second injection-locked oscillator is in a locked or unlocked state based on the master clock signal and a second output signal from the second injection-locked oscillator distribution circuit, the first and second reference clock signals having a higher frequency than the master clock signal, and the injection-locked oscillator distribution circuit further configured to generate the first output signal via down-converting the first reference clock signal, and to generate the second output signal via down-converting the second reference clock signal.

2. The clock distribution system of claim 1 wherein the first injection-locked oscillator distribution circuit is configured to generate the first output signal indicative of an operating frequency of the first injection-locked oscillator, and the second injection-locked oscillator distribution circuit is configured to generate the second output signal indicative of an operating frequency of the second injection-locked oscillator.

3. The clock distribution system of claim 1 wherein the clock generator includes a master phase-locked loop and a multi-phase clock pulse-generator, the master phase locked loop configured to receive a reference frequency signal as an input and generate an output signal having a phase that is clocked to the phase of the reference frequency signal, the multi-phase clock pulse-generator configured to receive the output signal from the master phase-locked loop and generate the master clock signal based on the output signal.

4. A clock distribution system for a radiofrequency system, the clock distribution system comprising:

a clock generator configured to generate a master clock signal;

a first injection-locked oscillator distribution circuit including a first injection-locked oscillator and configured to receive the master clock signal and generate a first reference clock signal based on the master clock signal;

a second injection-locked oscillator distribution circuit including a second injection-locked oscillator and configured to receive the master clock signal and generate a second reference clock signal based on the master clock signal; and a lock detector circuit configured to determine whether the first injection-locked oscillator is in a locked or unlocked state based on the master clock signal and a first output signal from the first injection-locked oscillator distribution circuit, and further configured to determine whether the second injection-locked oscillator is in a locked or unlocked state based on the master clock signal and a second output signal from the second injection-locked oscillator distribution circuit, the lock detector circuit is configured to mix a selected one of the first and second output signals with the master clock signal to generate an intermediate mixed signal, and to determine a locked state or unlocked state based on the intermediate mixed signal.

5. The clock distribution system of claim 4 wherein the first reference clock signal has a higher frequency than the master clock signal, the second reference clock signal has a higher frequency than the master clock signal, and the injection-locked oscillator distribution circuit is further configured to generate the first output signal via down-converting the first reference clock signal, and to generate the second output signal via down-converting the second reference clock signal.

6. The clock distribution system of claim 4 wherein the first injection-locked oscillator distribution circuit is configured to generate the first output signal indicative of an operating frequency of the first injection-locked oscillator, and the second injection-locked oscillator distribution circuit is configured to generate the second output signal indicative of an operating frequency of the second injection-locked oscillator.

7. A clock distribution system for a radiofrequency system, the clock distribution system comprising:

a clock generator configured to generate a master clock signal;

a first injection-locked oscillator distribution circuit including a first injection-locked oscillator and configured to receive the master clock signal and generate a first reference clock signal based on the master clock signal;

a second injection-locked oscillator distribution circuit including a second injection-locked oscillator and configured to receive the master clock signal and generate a second reference clock signal based on the master clock signal; and lock detector circuit configured to determine whether the first injection-locked oscillator is in a locked or unlocked state based on the master clock signal and a first output signal from the first injection-locked oscillator distribution circuit, and further configured to determine whether the second injection-locked oscillator is in a locked or unlocked state based on the master clock signal and a second output signal from the second injection-locked oscillator distribution circuit, the first injection-locked oscillator distribution circuit further including a first mixer configured to generate the first output signal and the second injection-locked oscillator distribution circuit further including a second mixer configured to generate the second output signal.

8. The clock distribution system of claim 7 wherein the first injection-locked oscillator distribution circuit is configured to generate the first output signal indicative of an operating frequency of the first injection-locked oscillator, and the second injection-locked oscillator distribution circuit is configured to generate the second output signal indicative of an operating frequency of the second injection-locked oscillator.

9. A clock distribution system for a radiofrequency system, the clock distribution system comprising:

a clock generator configured to generate a master clock signal;

a first injection-locked oscillator distribution circuit including a first injection-locked oscillator and configured to receive the master clock signal and generate a first reference clock signal based on the master clock signal;

a second injection-locked oscillator distribution circuit including a second injection-locked oscillator and configured to receive the master clock signal and generate a second reference clock signal based on the master clock signal; and a lock detector circuit configured to determine whether the first injection-locked oscillator is in a locked or unlocked state based on the master clock signal and a first output signal from the first injection-locked oscillator distribution circuit, and further configured to determine whether the second injection-locked oscillator is in a locked or unlocked state based on the master clock signal and a second output signal from the second injection-locked oscillator distribution circuit, the first injection-locked oscillator distribution circuit further including first divider circuitry configured to generate the first output signal and the second injection-locked oscillator distribution circuit further including second divider circuitry configured to generate the second output signal.

10. The clock distribution system of claim 9 wherein the first injection-locked oscillator distribution circuit is configured to generate the first output signal indicative of an operating frequency of the first injection-locked oscillator, and the second injection-locked oscillator distribution circuit is configured to generate the second output signal indicative of an operating frequency of the second injection-locked oscillator.

11. A method of distributing a clock signal for a radio frequency system, the method comprising:

generating a master clock signal;

receiving, at a first injection-locked oscillator distribution circuit, the master clock signal;

generating, with the first injection-locked oscillator distribution circuit, a first reference clock signal based on the master clock signal;

receiving, at a second injection-locked oscillator distribution circuit, the master clock signal;

generating, with the second injection-locked oscillator distribution circuit, a second reference clock signal based on the master clock signal;

receiving, at a lock detector, the master clock signal, a first output signal from the first injection-locked oscillator distribution circuit, and a second output signal from the first injection-locked oscillator distribution circuit;

determining, by the lock detector, whether a first injection-locked oscillator of the first injection-locked oscillator distribution circuit is in a locked state or in an unlocked state based on the master clock signal and the first output signal;

determining, by the lock detector, whether a second injection-locked oscillator of the second injection-locked oscillator distribution circuit is in a locked state or in an unlocked state based on the master clock signal and the second output signal;

generating, with the first injection-locked oscillator distribution circuit, the first output signal via down-converting the first reference clock signal; and generating, with the second injection-locked oscillator distribution circuit, the second output signal via down-converting the second reference clock signal, the first and second reference clock signals having higher frequencies than the master clock signal.

12. The method of claim 11 further comprising:

generating the first output signal with a first mixer of the first injection-locked oscillator distribution circuit; and generating the second output signal with a second mixer of the second injection-locked oscillator distribution circuit.

13. The method of claim 11 further comprising:

mixing a selected one of the first output signal and the second output signal with the master clock signal to generate an intermediate mixed signal; and determining whether the injection-locked oscillator is in the locked state or in the unlocked state based on the intermediate mixed signal.

14. A mobile device, comprising:

one or more antennas;

an injection-locked oscillator distribution system including a clock generator configured to generate a master clock signal, a first injection-locked oscillator distribution circuit including a first injection-locked oscillator and configured to receive the master clock signal and generate a first reference clock signal based on the master clock signal, and a second injection-locked oscillator distribution circuit including a second injection-locked oscillator and configured to receive the master clock signal and generate a second reference clock signal based on the master clock signal, the injection-locked oscillator distribution system configured to determine whether the first injection-locked oscillator is in a locked or unlocked state based on the master clock signal and a first output signal from the first injection-locked oscillator distribution circuit, and further configured to determine whether the second injection-locked oscillator is in a locked or unlocked state based on the master clock signal and a second output signal from the second injection-locked oscillator distribution circuit, the first reference clock signal having a higher frequency than the master clock signal, the second reference clock signal having a higher frequency than the master clock signal, and the injection-locked oscillator distribution circuit further configured to generate the first output signal via down-converting the first reference clock signal to a frequency of the master clock signal, and to generate the second output signal via down-converting the second reference clock signal to a frequency of the master clock signal; and one or more transceivers operatively connected to the one or more antennas and configured to use the first and second reference clock signals.

15. The mobile device of claim 14 wherein the clock generator includes a master phase-locked loop and a multi-phase clock pulse-generator, the master phase-locked loop configured to receive a reference frequency signal as an input and generate an output signal having a phase that is clocked to the phase of the reference frequency signal, the multi-phase clock pulse-generator configured to receive the output signal from the master phase-locked loop and generate the master clock signal based on the output signal.

16. The mobile device of claim 14 wherein the first injection-locked oscillator distribution circuit further includes a first mixer configured to generate the first output signal and the second injection-locked oscillator distribution circuit further includes a second mixer configured to generate the second output signal.

17. The mobile device of claim 14 wherein the first injection-locked oscillator distribution circuit further includes first divider circuitry configured to generate the first output signal and the second injection-locked oscillator distribution circuit further includes second divider circuitry configured to generate the second output signal.

18. A mobile device, comprising:

one or more antennas;

an injection-locked oscillator distribution system including a clock generator configured to generate a master clock signal, a first injection-locked oscillator distribution circuit including a first injection-locked oscillator and configured to receive the master clock signal and generate a first reference clock signal based on the master clock signal, and a second injection-locked oscillator distribution circuit including a second injection-locked oscillator and configured to receive the master clock signal and generate a second reference clock signal based on the master clock signal, the injection-locked oscillator distribution system configured to determine whether the first injection-locked oscillator is in a locked or unlocked state based on the master clock signal and a first output signal from the first injection-locked oscillator distribution circuit, and further configured to determine whether the second injection-locked oscillator is in a locked or unlocked state based on the master clock signal and a second output signal from the second injection-locked oscillator distribution circuit, the injection-locked distribution system configured to mix a selected one of the first and second output signals with the master clock signal to generate an intermediate mixed signal, and to determine a locked state or unlocked state based on the intermediate mixed signal; and one or more transceivers operatively connected to the one or more antennas and configured to use the first and second reference clock signals.

19. The mobile device of claim 18 wherein the first injection-locked oscillator distribution circuit further includes a first mixer configured to generate the first output signal and the second injection-locked oscillator distribution circuit further includes a second mixer configured to generate the second output signal.

20. The mobile device of claim 18 wherein the first injection-locked oscillator distribution circuit further includes first divider circuitry configured to generate the first output signal and the second injection-locked oscillator distribution circuit further includes second divider circuitry configured to generate the second output signal.

* * * * *